(12) United States Patent
Kim et al.

(10) Patent No.: US 11,937,460 B2
(45) Date of Patent: Mar. 19, 2024

(54) TRANSPARENT DISPLAY DEVICE

(71) Applicant: LG Display Co., Ltd., Seoul (KR)

(72) Inventors: EuiTae Kim, Paju-si (KR); ChangSoo Kim, Paju-si (KR); KiSeob Shin, Paju-si (KR); Soyi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/132,716

(22) Filed: Dec. 23, 2020

(65) Prior Publication Data

US 2021/0202628 A1   Jul. 1, 2021

(30) Foreign Application Priority Data

Dec. 30, 2019 (KR) .......................... 10-2019-0178572

(51) Int. Cl.
| | |
|---|---|
| *H10K 59/122* | (2023.01) |
| *H10K 50/816* | (2023.01) |
| *H10K 50/828* | (2023.01) |
| *H10K 50/84* | (2023.01) |
| *H10K 59/124* | (2023.01) |
| *H10K 59/38* | (2023.01) |

(52) U.S. Cl.
CPC ......... *H10K 59/122* (2023.02); *H10K 50/816* (2023.02); *H10K 50/828* (2023.02); *H10K 50/84* (2023.02); *H10K 59/124* (2023.02); *H10K 59/38* (2023.02)

(58) Field of Classification Search
CPC ............... H01L 27/3246; H01L 27/322; H01L 27/3258; H01L 51/5215; H01L 51/5234; H01L 51/5237

USPC .......................................................... 257/40
See application file for complete search history.

(56) References Cited

U.S. PATENT DOCUMENTS

| | | | |
|---|---|---|---|
| 10,403,847 B2 | 9/2019 | Chung et al. | |
| 2011/0175097 A1* | 7/2011 | Song | H01L 27/3276 257/59 |
| 2016/0093679 A1 | 3/2016 | Moon et al. | |
| 2018/0061894 A1* | 3/2018 | Kim | H01L 51/5268 |

(Continued)

FOREIGN PATENT DOCUMENTS

| | | |
|---|---|---|
| CN | 105575997 A | 5/2016 |
| CN | 110010645 A | 7/2019 |

(Continued)

*Primary Examiner* — Xia L Cross
(74) *Attorney, Agent, or Firm* — Seed IP Law Group LLP

(57) ABSTRACT

A transparent display device is disclosed, which may enlarge a transmissive area and increase or maximize a light emission area in a non-transmissive area. The transparent display device includes a substrate provided with a display area including a transmissive area and a non-transmissive area, in which a plurality of subpixels are disposed, and a non-display area adjacent to the display area, at least one inorganic insulating film on the substrate, at least one organic insulating film on the at least one inorganic insulating film, anode electrodes provided in each of the plurality of subpixels over the at least one organic insulating film, a bank provided among the anode electrodes, a light emitting layer on the anode electrodes, and a cathode electrode on the light emitting layer, wherein the at least one inorganic insulating film, the at least one organic insulating film and the bank are provided in only the non-transmissive area.

8 Claims, 11 Drawing Sheets

(56) References Cited

U.S. PATENT DOCUMENTS

| | | | |
|---|---|---|---|
| 2021/0066410 A1* | 3/2021 | Jo | H01L 27/3234 |
| 2021/0066648 A1* | 3/2021 | Chung | H01L 27/3234 |
| 2021/0191552 A1* | 6/2021 | Bok | G06F 1/1658 |
| 2021/0296418 A1* | 9/2021 | Park | H01L 27/3246 |

FOREIGN PATENT DOCUMENTS

| | | |
|---|---|---|
| KR | 10-2018-0116512 A | 10/2018 |
| KR | 10-2019-0007983 A | 1/2019 |
| KR | 10-2019-0080312 A | 7/2019 |

* cited by examiner

TRANSPARENT DISPLAY DEVICE

CROSS REFERENCE TO RELATED APPLICATION

This application claims priority from Korean Patent Application No. 10-2019-0178572, filed on Dec. 30, 2019, which is hereby incorporated by reference for all purposes as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after the objects or image transmits the display device are actively ongoing.

A transparent display device includes a display area on which an image is displayed, and a non-display area, wherein the display area may include a transmissive area that may transmit external light, and a non-transmissive area. A size of the transmissive area is important to improve light transmittance in the transparent display device.

However, in the transparent display device of the related art, after a light emitting diode is formed on a first substrate and a color filter and a black matrix are formed on a second substrate, the first substrate and the second substrate may be bonded to each other. At this time, considering a bonding margin of the first substrate and the second substrate, the color filter is formed with an area wider than a desired area. Therefore, in the transparent display device of the related art, the transmissive area is unnecessarily reduced by the color filter.

BRIEF SUMMARY

The inventors of the present disclosure have recognized the following approach in the related art may be problematic. For example, in the transparent display device of the related art, after a light emitting diode is formed on a first substrate and a color filter and a black matrix are formed on a second substrate, the first substrate and the second substrate may be bonded to each other. Here, considering the bonding margin of the first substrate and the second substrate, the color filter is formed with an area wider than a desired area. The inventors have realized that with such approach in the related art, the transmissive area is unnecessarily reduced by the color filter.

Accordingly, the inventors of the present disclosure have suggested one or more embodiments addressing one or more problems of the related art including the above recognized problems by the inventors.

One or more embodiments of the present disclosure provides a transparent display device that may enlarge a transmissive area.

Further embodiments, of the present disclosure provides a transparent display device that may increase or maximize a light emission area in a non-transmissive area.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a substrate provided with a display area including a transmissive area and a non-transmissive area, in which a plurality of subpixels are disposed, and a non-display area surrounding the display area, at least one inorganic insulating film on the substrate, at least one organic insulating film on the at least one inorganic insulating film, anode electrodes provided in each of the plurality of subpixels over the at least one organic insulating film, a bank provided among the anode electrodes, a light emitting layer on the anode electrodes, and a cathode electrode on the light emitting layer, wherein the at least one inorganic insulating film, the at least one organic insulating film and the bank are provided in only the non-transmissive area.

In accordance with another aspect of the present disclosure, the above and other benefits can be accomplished by the provision of a transparent display device comprising a substrate provided with a display area including a transmissive area and a non-transmissive area, in which a plurality of subpixels are disposed, and a non-display area surrounding the display area, at least one organic insulating film on the substrate, anode electrodes provided in each of the plurality of subpixels over the at least one organic insulating film, a bank provided among the anode electrodes, a light emitting layer on the anode electrodes, a cathode electrode on the light emitting layer, an encapsulation film on the cathode electrode, and a color filter on the encapsulation film, adjoining the encapsulation film. In one embodiment, the at least one organic insulating film and the bank are provided in only the non-transmissive area. However, this is not required.

According to the present disclosure, an opening area overlapped with the transmissive area may be formed in an inorganic insulating film having a high refractive index, whereby light transmittance of the transmissive area may be improved.

Also, according to the present disclosure, an opening area overlapped with the transmissive area may be formed in an organic insulating film having a high yellow index, whereby a yellowish phenomenon may be prevented from occurring in the transmissive area.

Also, according to the present disclosure, a bank may be made of a material that absorbs light and formed to overlay a side of the inorganic insulating film and a side of the organic insulating film, which are exposed from the opening area, whereby external light may be prevented from being refracted at the side of the inorganic insulating film and the side of the organic insulating film.

Also, according to the present disclosure, common power lines and pixel power lines may alternately be disposed in the display area, and the transmissive area may be provided between the common power line and the pixel power line. Also, a first subpixel may be provided in an area where a gate line and the common power line cross each other, and a third subpixel may be provided in an area where the gate line and the pixel power line cross each other, and a third subpixel may be provided in an area where the gate line and the pixel power line cross each other, whereby a second subpixel may be provided between the first subpixel and the third subpixel. Therefore, the present disclosure may improve transmittance by increasing or maximizing the transmissive area.

Also, according to the present disclosure, a step difference between the transmissive area and the non-transmissive area may be reduced using a step compensation film, whereby a crack may be prevented from occurring in an inorganic film constituting an encapsulation film.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
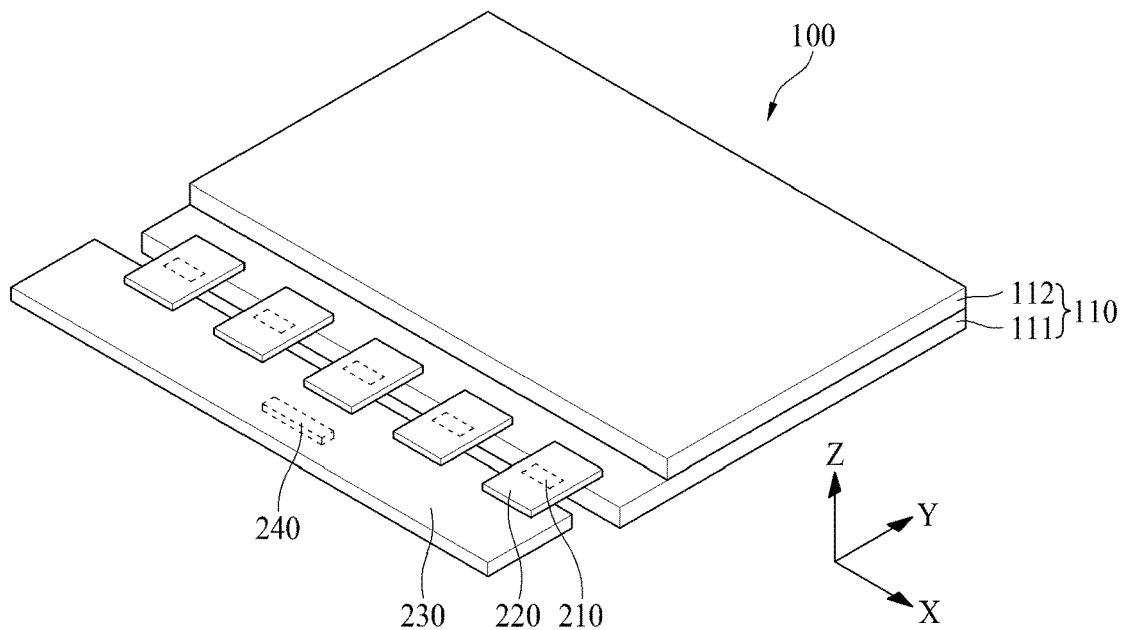
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device (LCD), a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of a transparent material.

The gate driver supplies gate signals to the gate lines in accordance with a gate control signal which is provided from the timing controller 240. The gate driver may be provided in one side of the display area of the transparent display panel 110, or the non-display area of both peripheral sides of the transparent display panel 110 by a gate driver in panel (GIP) method. In another way, the gate driver may be manufactured in a driving chip, may be mounted on the flexible film, and may be attached to one side of the display area of the transparent display panel 110, or the non-display area of both peripheral sides of the transparent display panel 110 by a tape automated bonding (TAB) method.

If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in a non-display area of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
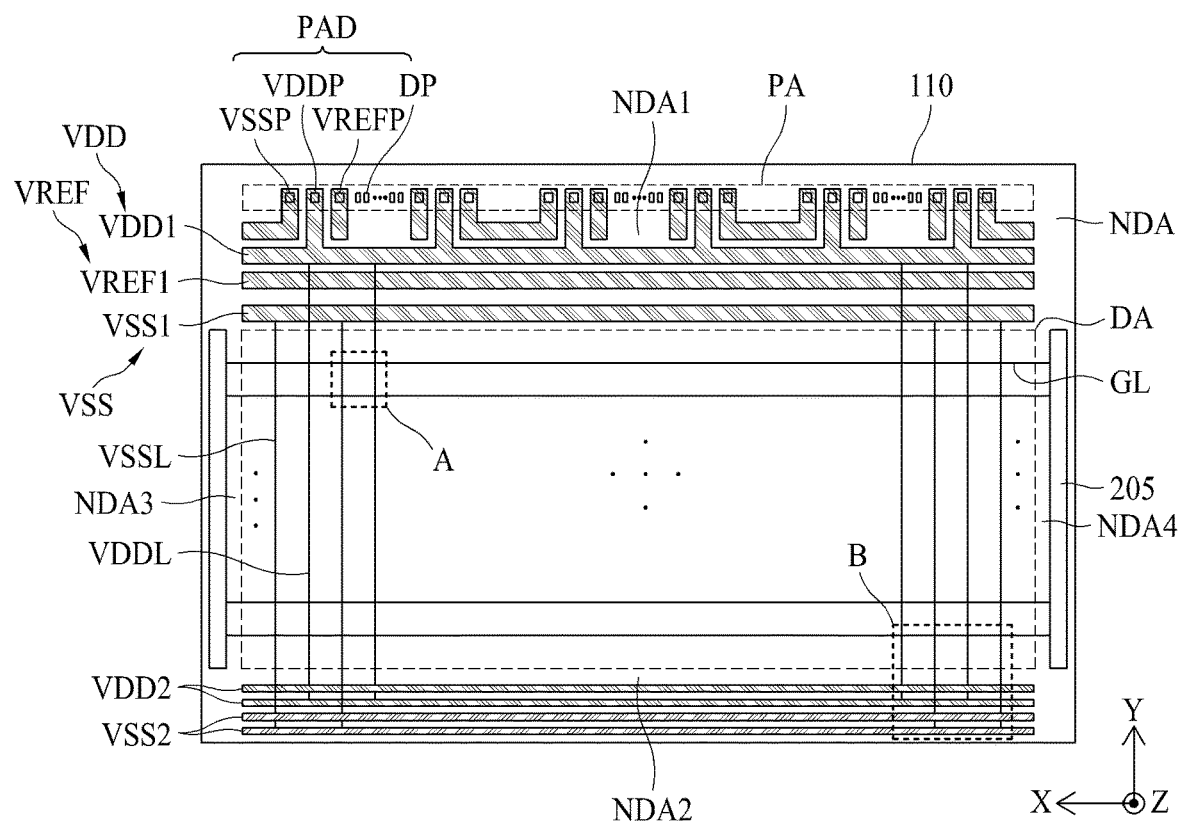
FIG. 2 is a schematic plane view illustrating a transparent display panel.
Figure 3:
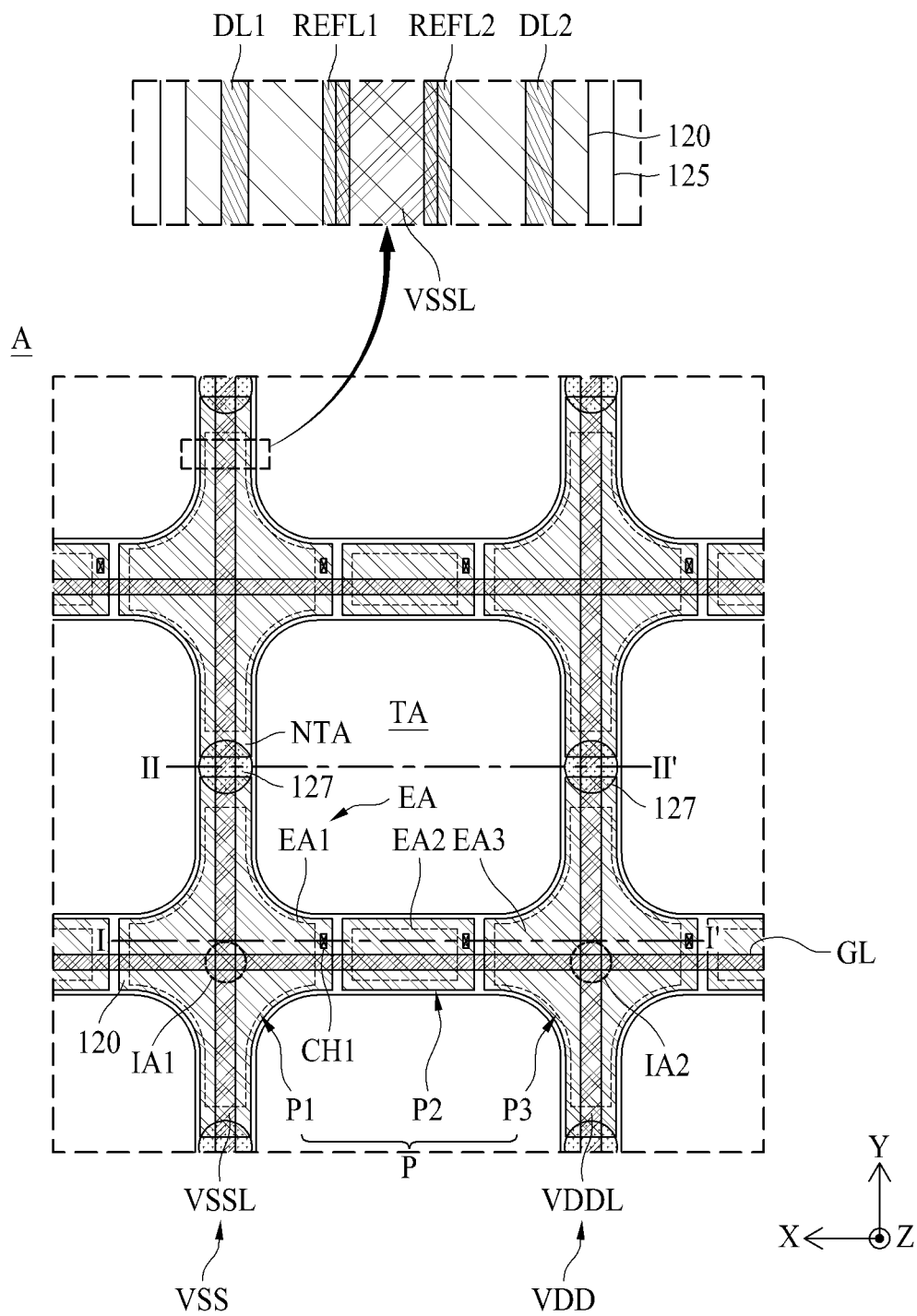
FIG. 3 is an enlarged view of an area A in FIG. 2.
Figure 4:
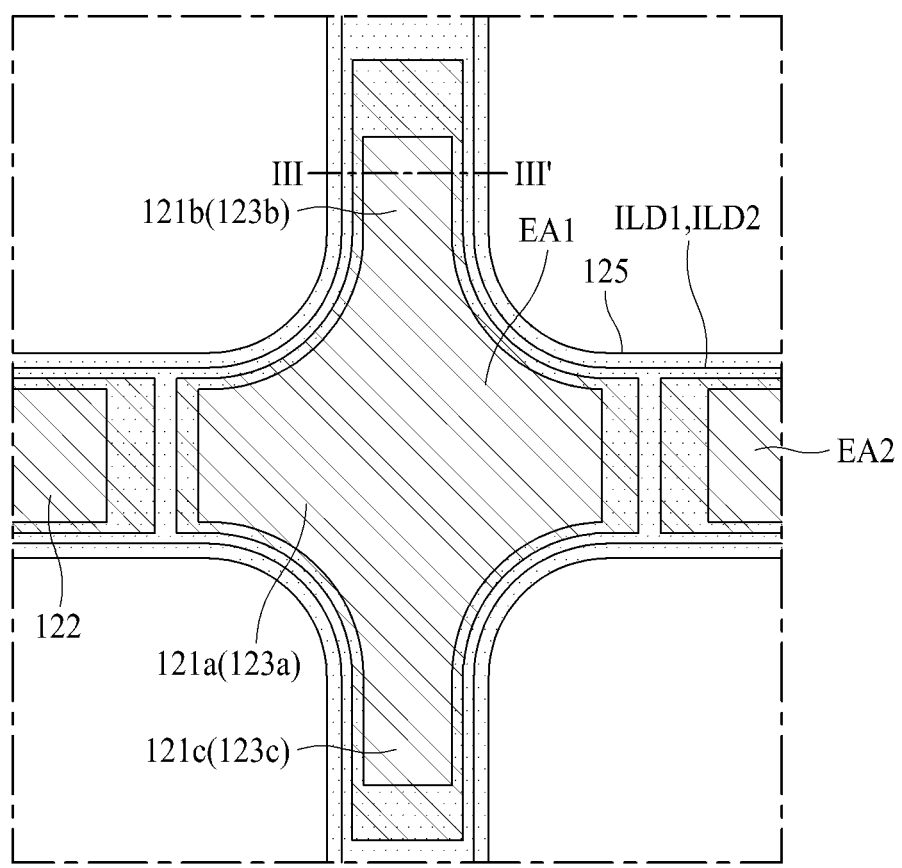
FIG. 4 is a plane view illustrating an anode electrode, a first inter-layer dielectric film, a second inter-layer dielectric film and a bank.
Figure 5:
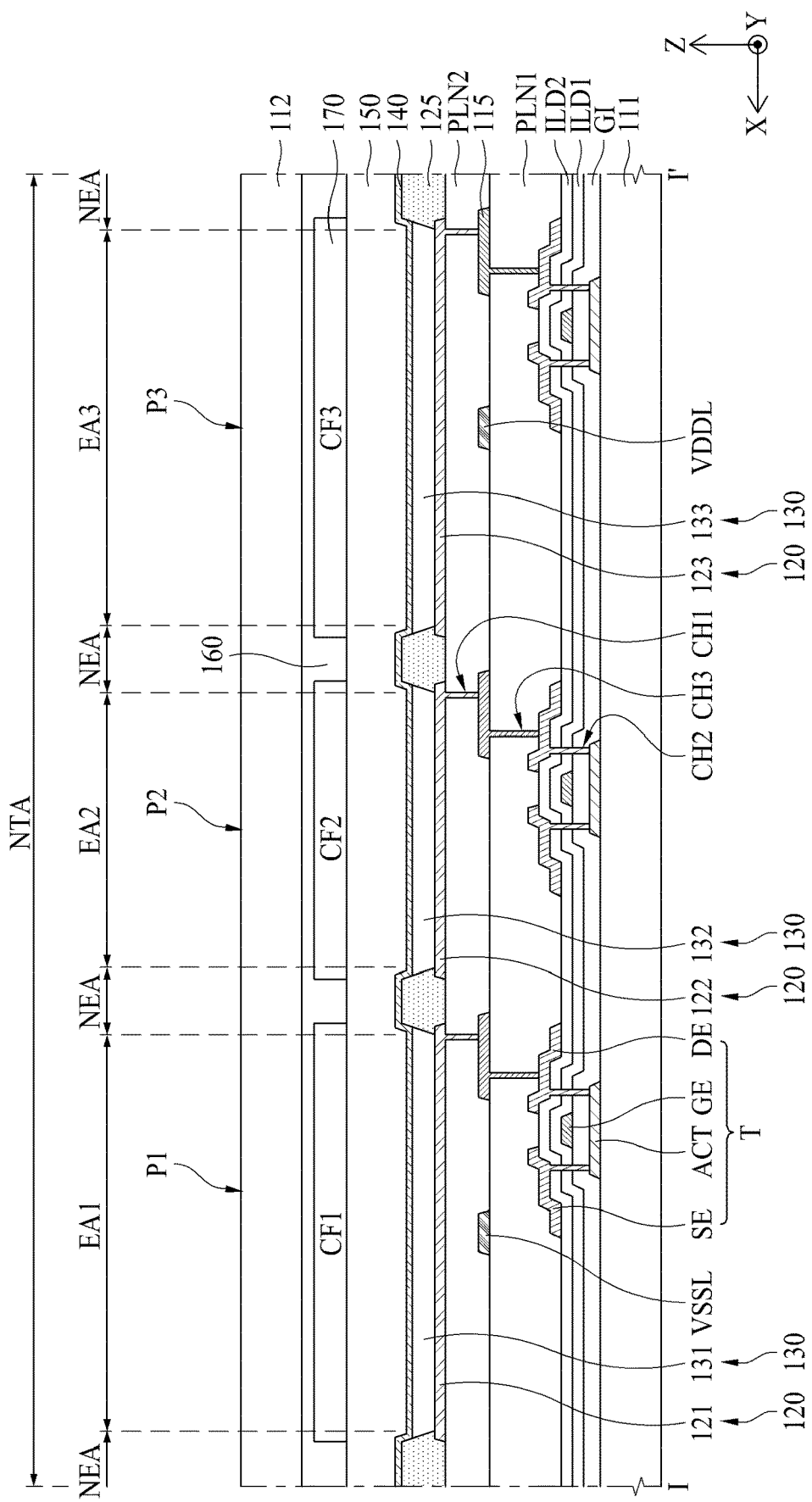
FIG. 5 is a cross-sectional view taken along line I-I' of FIG. 3.
Figure 6:
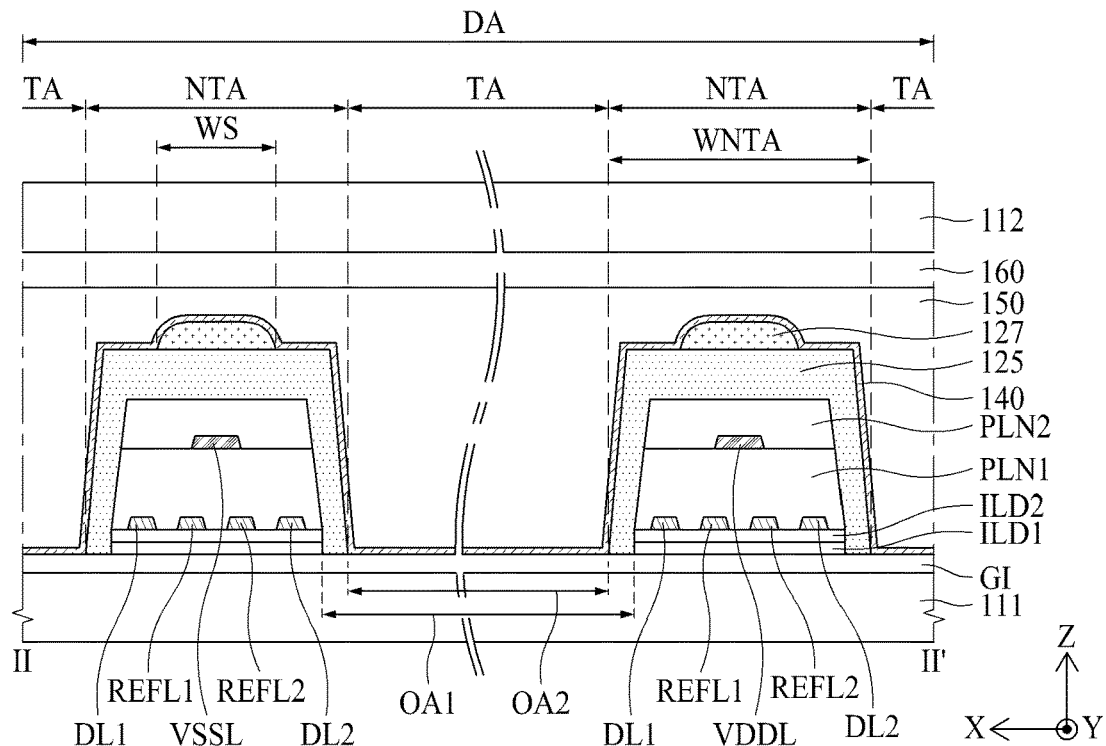
FIG. 6 is a cross-sectional view taken along line II-II' of FIG. 3.
Figure 7:
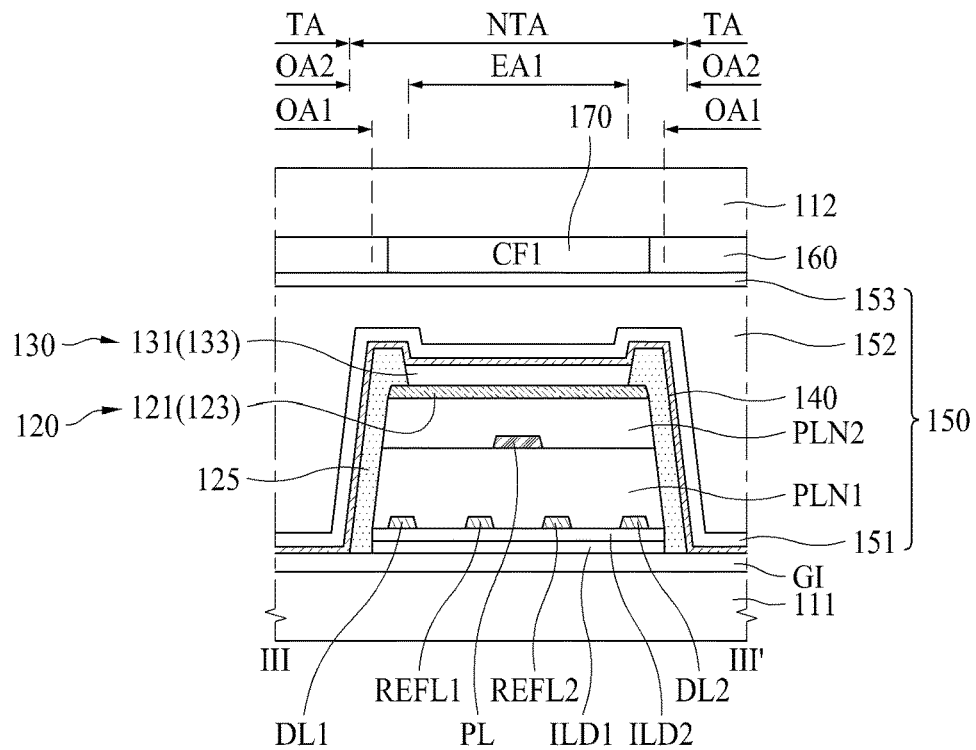
FIG. 7 is a cross-sectional view taken along line of FIG. 4.
Figure 8:
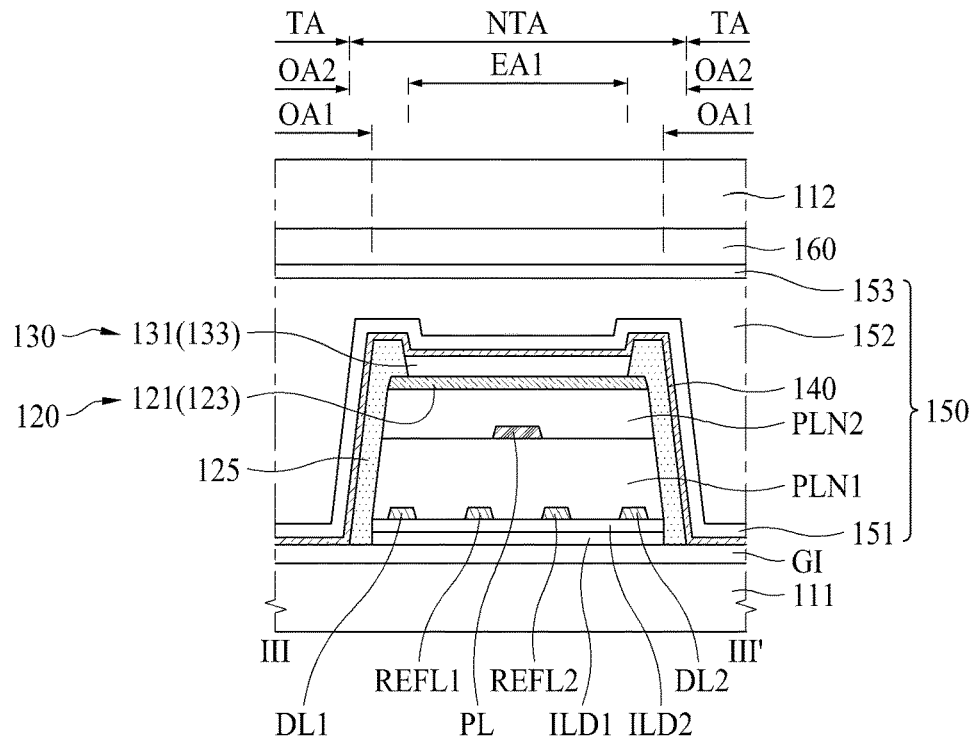
FIG. 8 is a cross-sectional view illustrating a modified embodiment of FIG. 7.
Figure 9:
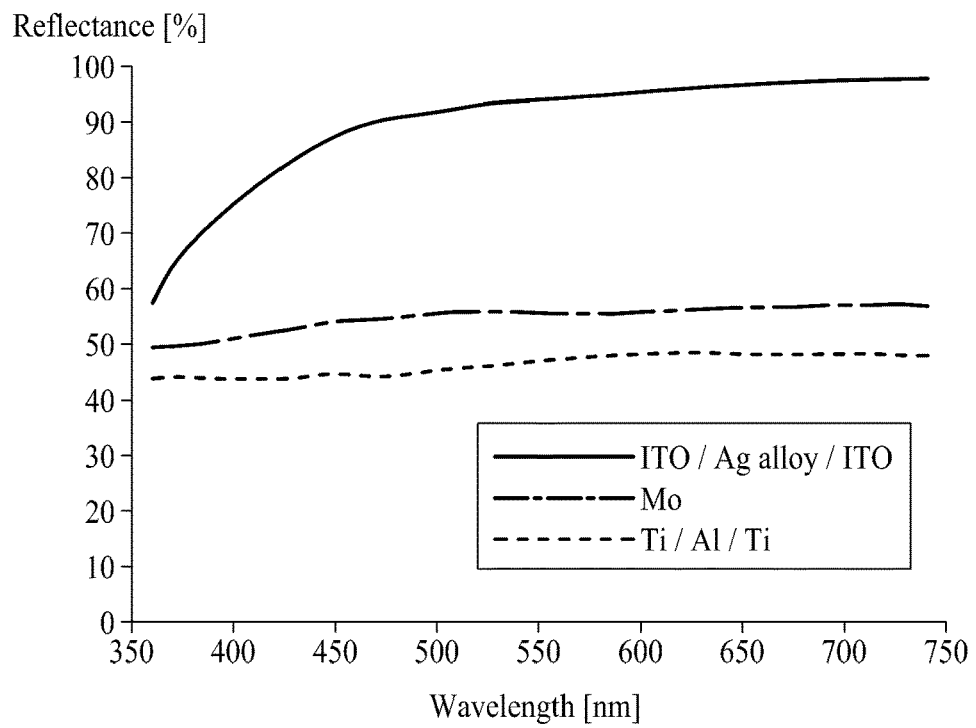
FIG. 9 is a graph illustrating reflectance of electrodes having different materials.
Figure 10:
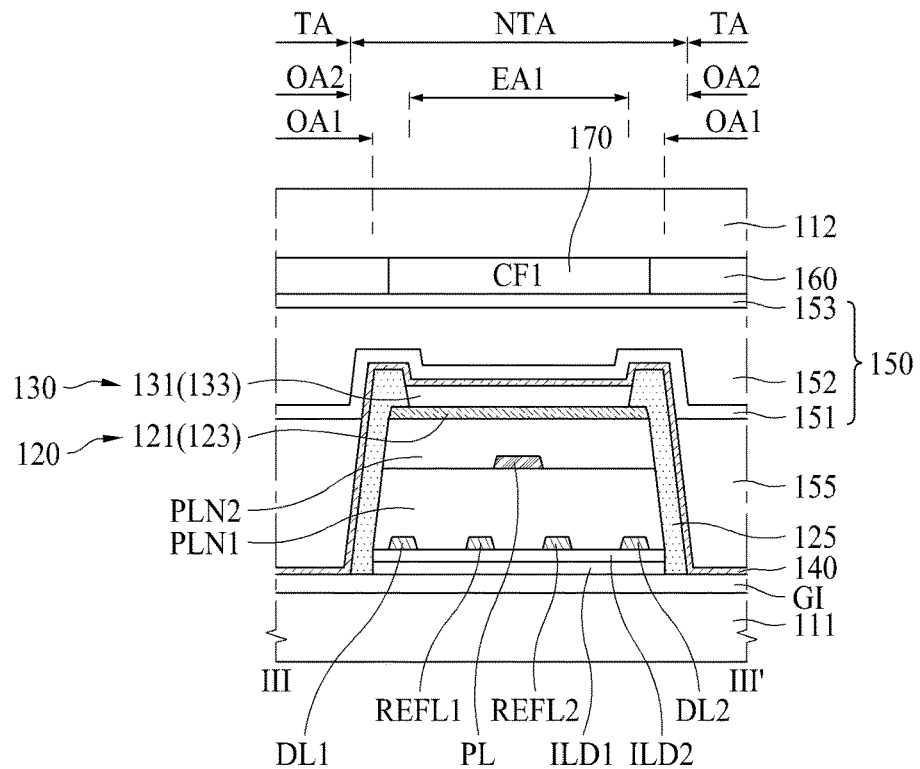
FIG. 10 is a cross-sectional view illustrating another modified embodiment of FIG. 7.
Figure 11:
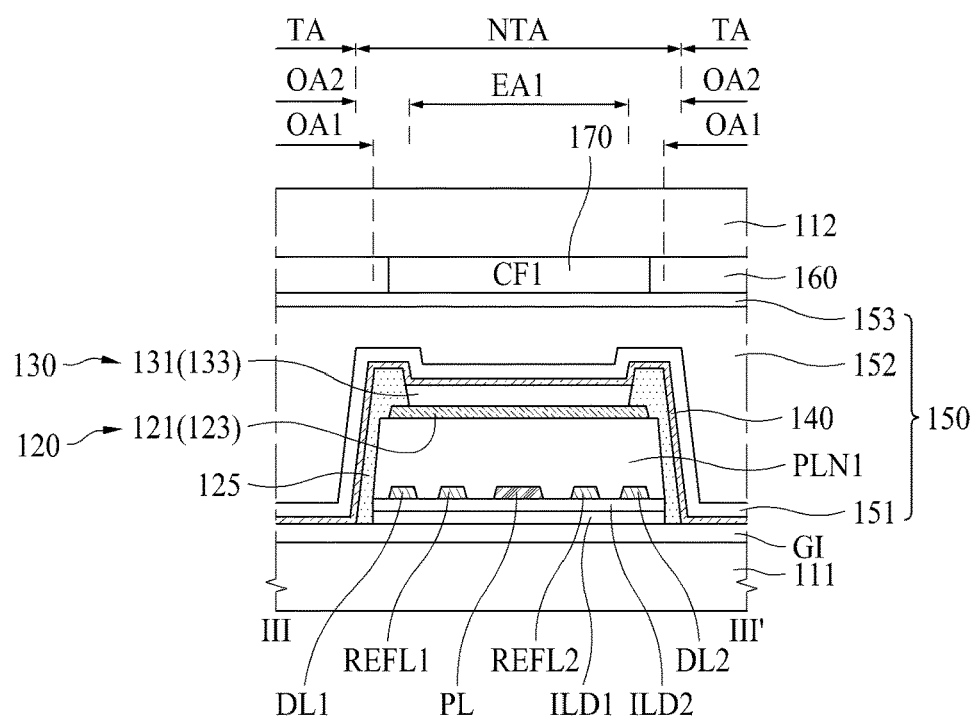
FIG. 11 is a cross-sectional view illustrating other modified embodiment of FIG. 7.

FIG. 2 is a schematic plane view illustrating a transparent display panel, FIG. 3 is an enlarged view of an area A in FIG. 2, FIG. 4 is a plane view illustrating an anode electrode, a first inter-layer dielectric film, a second inter-layer dielectric film and a bank, FIG. 5 is a cross-sectional view taken along line I-I' of FIG. 3, FIG. 6 is a cross-sectional view taken along line II-IP of FIG. 3, FIG. 7 is a cross-sectional view taken along line of FIG. 4, FIG. 8 is a cross-sectional view illustrating a modified embodiment of FIG. 7, FIG. 9 is a graph illustrating reflectance of electrodes having different materials, FIG. 10 is a cross-sectional view illustrating another modified embodiment of FIG. 7, FIG. 11 is a cross-sectional view illustrating other modified embodiment of FIG. 7.

The substrate 111 may include a display area DA where pixels P are formed to display an image, and a non-display area NDA that does not display an image.

The display area DA, as shown in FIG. 3, includes a transmissive area TA and a non-transmissive area NTA. The transmissive area TA is an area through which most of externally incident light passes, and the non-transmissive area NTA is an area through which most of externally incident light fails to transmit. For example, the transmissive area TA may be an area where light transmittance is greater than α%, for example, 90%, and the non-transmissive area NTA may be an area where light transmittance is smaller than (3%, for example, 50%. At this time, α is greater than β. A user may view an object or background arranged on a rear surface of the transparent display panel 110 due to the transmissive area TA.

The non-transmissive area NTA may be provided with pixel power lines VDD(VDDL), common power lines VSS (VSSL), reference lines, data lines, gate lines GL, and pixels P.

The gate lines GL may be extended in a first direction (e.g., X axis direction), and may cross (or overlap) the pixel power lines VDD(VDDL), the common power lines VSS (VSSL) and the data lines in the display area DA.

The pixel power lines VDD(VDDL), the common power lines VSS(VSSL), the reference lines and the data lines may be extended in a second direction (e.g., Y axis direction). At this time, the pixel power lines VDD(VDDL) and the common power lines VSS(VSSL) may alternately be disposed in the display area DA. The transmissive area TA may be disposed between the pixel power line VDD(VDDL) and the common power line VSS(VSSL).

The pixels P emit predetermined light to display an image. An emission area EA may correspond to an area, from which light emits, in the pixel P.

Each of the pixels P may include a first subpixel P1, a second subpixel P2, and a third subpixel P3. The first subpixel P1 may be provided to include a first emission area EA1 emitting green light, the second subpixel P2 may be provided to include a second emission area EA2 emitting red light, and the third subpixel P3 may be provided to include a third emission area EA3 emitting blue light, but these subpixel are not limited thereto. Each of the pixels P may further include a subpixel emitting white light W. An arrangement sequence of the subpixel P1, P2 and P3 may be changed in various ways.

Hereinafter, for convenience of description, a description will be given based on that the first subpixel P1 is a green subpixel emitting green light, the second subpixel P2 is a red subpixel emitting red light, and the third subpixel P3 is a blue subpixel emitting blue light.

Each of the first subpixel P1 and the third subpixel P3 may be disposed to overlap any one of a first intersection area IA1 where the common power line VSS(VSSL) and the gate line GL cross each other and a second intersection area IA2 where the pixel power line VDD(VDDL) and the gate line GL cross each other.

For example, at least a part of the first subpixel P1, as shown in FIG. 3, may be disposed to overlap the first intersection area IA1 where the common power line VSS (VSSL) and the gate line GL cross each other, but is not limited thereto. At least a part of the third subpixel P3 may be disposed to overlap the second intersection area IA2 where the pixel power line VDD(VDDL) and the gate line GL cross each other, but is not limited thereto. The first subpixel P1 may be disposed to overlap the second intersection area IA2, and the third subpixel P3 may be disposed to overlap the first intersection area IA1. Also, the first subpixel P1 and the s third subpixel P3 may be disposed alternately along the common power line VSS(VSSL), or may be disposed alternately along the pixel power line VDD(VDDL).

The second subpixel P2 may be disposed between the first intersection area IA1 and the second intersection area IA2.

For example, the second subpixel P2 may be disposed between the first subpixel P1 and the third subpixel P3. At this time, at least a part of the second subpixel P2 may be overlapped with the gate line GL.

Each of the first subpixel P1, the second subpixel P2 and the third subpixel P3 may include a circuit element that includes a capacitor, a thin film transistor, etc., and a light emitting diode. The thin film transistor may include a switching transistor, a sensing transistor, and a driving transistor T.

The switching transistor is switched in accordance with a gate signal supplied to the gate line GL and serves to supply a data voltage supplied from the data line to the driving transistor T.

The sensing transistor serves to sense a threshold voltage deviation of the driving transistor T, which is a cause of image quality degradation.

The driving transistor T is switched in accordance with the data voltage supplied from the switching transistor to generate a data current from a power source supplied from the pixel power line VDD(VDDL), and serves to supply the generated data current to the anode electrode 120 of the pixel.

The driving transistor T includes an active layer ACT, a gate electrode GE, a source electrode SE, and a drain electrode DE.

In detail, the active layer ACT may be on the first substrate 111. The active layer ACT may be formed of a silicon based semiconductor material or an oxide based semiconductor material. A buffer layer (not shown) may be provided between the active layer ACT and the first substrate 111.

A gate insulating layer GI may be on the active layer ACT. The gate insulating layer GI may be formed of an inorganic film, for example, a silicon oxide (SiOx) film, a silicon nitride (SiNx) film, or a multi-layered film of SiOx and SiNx.

A gate electrode GE may be on the gate insulating layer GI. The gate electrode GE may be formed of a single layer or a multi-layer made of any one of Mo, Al, Cr, Au, Ti, Ni, Nd and Cu or their alloy.

A first inter-layer insulating layer ILD1 and a second inter-layer insulating layerILD2 may be on the gate electrode GE. The first inter-layer insulating layerILD1 and the second inter-layer insulating layerILD2 may be formed of an inorganic layer, for example, a silicon oxide (SiOx) layer, a silicon nitride (SiNx) layer, or a multi-layered layer of SiOx and SiNx.

In the transparent display panel 110 according to one embodiment of the present disclosure, at least a portion of inorganic insulating films provided between the first substrate 110 and the anode electrode 120 may be provided in only the non-transmissive area NTA, and may not be provided in the transmissive area TA. That is, at least one inorganic insulating film provided between the first substrate 110 and the anode electrode 120 may include a first opening area OA1 overlapped with the transmissive area TA.

In detail, the inorganic insulating films provided between the first substrate 110 and the anode electrode 120 may include a gate insulating film GI, a first inter-layer dielectric film ILD1, and a second inter-layer dielectric film ILD2.

Each of the gate insulating film GI, the first inter-layer dielectric film ILD1 and the second inter-layer dielectric film ILD2 may be made of an inorganic film such as a silicon oxide (SiOx) film having a refractive index of 1.4 to 1.5 or a silicon nitride (SiNx) film having a refractive index of 1.8 to 1.9. If a high refractive film such as SiNx is formed in the transmissive area TA, externally incident light may be reflected from the high refractive film, whereby light loss may occur. As a result, transmittance of the transparent display panel 110 may be reduced in the transmissive area TA.

The transparent display panel 110 according to one embodiment of the present disclosure may remove high refractive films from the transmissive area TA to improve transmittance in the transmissive area TA.

At least one of the gate insulating film GI, the first inter-layer dielectric film ILD1 and the second inter-layer dielectric film ILD2 may be formed of a silicon nitride (SiNx) film. For example, the gate insulating film GI may be formed of a silicon oxide (SiOx) film, and the first inter-layer dielectric film ILD1 and the second inter-layer dielectric film ILD2 may be formed of silicon nitride (SiNx) films. In this case, the first inter-layer dielectric film ILD1 and the second inter-layer dielectric film ILD2 may be provided in only the non-transmissive area NTA, and may not be provided in the transmissive area TA. That is, the first inter-layer dielectric film ILD1 and the second inter-layer dielectric film ILD2 may include the first opening area OA1 overlapped with the transmissive area TA.

For another example, all of the gate insulating film GI, the first inter-layer dielectric film ILD1 and the second inter-layer dielectric film ILD2 may be formed of silicon nitride (SiNx) films. In this case, the gate insulating film GI, the first inter-layer dielectric film ILD1 and the second inter-layer dielectric film ILD2 may be provided in only the non-transmissive area NTA, and may not be provided in the transmissive area TA. That is, the gate insulating film GI, the first inter-layer dielectric film ILD1 and the second inter-layer dielectric film ILD2 may include the first opening area OA1 overlapped with the transmissive area TA.

For other example, only the second inter-layer dielectric film ILD2 may be formed of silicon nitride (SiNx) films. In this case, the second inter-layer dielectric film ILD2 may be provided in only the non-transmissive area NTA, and may not be provided in the transmissive area TA. That is, the second inter-layer dielectric film ILD2 may include the first opening area OA1 overlapped with the transmissive area TA.

In the transparent display panel 110 according to one embodiment of the present disclosure, the first opening area OA1 overlapped with the transmissive area TA may be formed in the high refractive film, whereby external light may be prevented from being lost in the transmissive area TA. Therefore, the transparent display panel 110 according to one embodiment of the present disclosure may improve transmittance in the transmissive area TA.

The source electrode SE and the drain electrode DE may be provided over the second inter-layer dielectric film ILD2. The source electrode SE and the drain electrode DE may be connected to the active layer ACT through a second contact hole CH2 that passes through the gate insulating film GI, the first inter-layer dielectric film ILD1 and the second inter-layer dielectric film ILD2.

The source and drain electrodes SE and DE may be formed of a single layer or a multi-layer made of any one of Mo, Al, Cr, Au, Ti, Ni, Nd and Cu or their alloy.

A first planarization layer PLN1 may be provided over the source and drain electrodes SE and DE to planarize a step difference caused by the driving transistor T. The first planarization layer PLN1 may be formed of an organic layer, for example, acryl resin, epoxy resin, phenolic resin, polyamide resin, polyimide resin, etc.

An anode auxiliary electrode 115 may be provided over the first planarization layer PLN1. The anode auxiliary electrode 115 may be connected to one of the source and drain electrodes SE and DE through a third contact hole CH3 that passes through the first planarization layer PLN1. For example, the anode auxiliary electrode 115 may be connected to the drain electrode DE through the third contact hole CH3 that passes through the first planarization layer PLN1.

The anode auxiliary electrode 115 may be formed of a single layer or a multi-layer made of any one of Mo, Al, Cr, Au, Ti, Ni, Nd and Cu or their alloy.

A second planarization layer PLN2 may be formed over the anode auxiliary electrode 115. The second planarization layer PLN2 may be formed of an organic layer, for example, acryl resin, epoxy resin, phenolic resin, polyamide resin, polyimide resin, etc.

In the transparent display panel 110 according to one embodiment of the present disclosure, at least a portion of the organic insulating films provided between the first substrate 110 and the anode electrode 120 may be provided in only the non-transmissive area NTA, and may not be provided in the transmissive area TA. That is, at least one organic insulating film provided between the first substrate 110 and the anode electrode 120 may include the first opening area OA1 overlapped with the transmissive area TA.

In detail, the organic insulating films provided between the first substrate 110 and the anode electrode 120 may include a first planarization film PLN1 and a second planarization film PLN2. For example, the first planarization film PLN1 and the second planarization film PLN2 may be made of an acrylic based material that includes photo acryl (PAC). The photo acryl (PAC) has excellent planarization characteristic and thus has excellent growth film uniformity on a surface. Therefore, uniform light emission characteristic of the light emitting diode may be obtained.

However, the photo acryl (PAC) may have a yellowish color due to material characteristic. If the first and second planarization films PLN1 and PLN2 made of the photo acryl (PAC) are formed over the entire surface including the transmissive area, a yellowish phenomenon may occur in the transmissive area TA. Therefore, light transmittance in the transmissive area may be deteriorated.

In the transparent display panel 110 according to one embodiment of the present disclosure, the first planarization film PLN1 and the second planarization film PLN2 may be formed of a material having excellent planarization characteristic, for example, photo acryl (PAC), and the first opening area OA1 overlapped with the transmissive area TA may be provided in the first planarization film PLN1 and the second planarization film PLN2. Therefore, in the transparent display panel 110 according to one embodiment of the present disclosure, uniform light emission characteristic of the light emitting diode may be obtained and at the same time a yellowish phenomenon may be prevented from occurring in the transmissive area TA.

Light emitting diodes formed of the anode electrode 120, the light emitting layer 130 and the cathode electrode 140 and the bank 125 are provided over the second planarization film PLN2.

The anode electrode 120 may be provided over the second planarization film PLN2 and thus connected with the driving transistor T. In detail, the anode electrode 120 may be connected to the anode auxiliary electrode 115 through a first contact hole CH1 that passes through the second planarization film PLN2. Since the anode auxiliary electrode 115 is connected to the source electrode SE or the drain electrode DE of the driving transistor T through a third contact hole CH3, the anode electrode 120 may electrically be connected with the driving transistor T.

The anode electrode 120 may be provided for each of the subpixels P1, P2 and P3. In detail, one anode electrode 120 may be formed in the first subpixel P1, another anode electrode 120 may be formed in the second subpixel P2, and other anode electrode 120 may be formed in the third subpixel P3. The anode electrode 120 is not provided in the transmissive area TA.

The anode electrode 120 according to one embodiment of the present disclosure may include a first anode electrode 121, a second anode electrode 122 and a third anode electrode 123.

The first anode electrode 121 may be disposed over the common power line VSS(VSSL). In detail, at least a part of the first anode electrode 121 may be disposed to overlap the first intersection area IA1 where the common power line VSS(VSSL) and the gate line GL cross each other.

The first anode electrode 121 may be provided over the common power line VSS(VSSL) in a plural number along the common power line VSS(VSSL). The subpixels provided with the plurality of first anode electrodes 121 may be at least one of the first subpixel P1 and the third subpixel P3. For example, the subpixels provided with the plurality of first anode electrodes 121 may be the first subpixels P1. For another example, the subpixels provided with the plurality of first anode electrodes 121 may be the third subpixels P3. For other example, the subpixels provided with the plurality of first anode electrodes 121 may be the first subpixels P1 and the third subpixels P3. At this time, the first subpixels P1 and the third subpixels P3 may alternately be disposed over the common power line VSS(VSSL).

The third anode electrode 123 may be disposed over the pixel power line VDD(VDDL). In detail, at least a part of the third anode electrode 123 may be disposed to overlap the second intersection area IA2 where the pixel power line VDD(VDDL) and the gate line GL cross each other.

The third anode electrode 123 may be provided over the pixel power line VDD(VDDL) in a plural number along the pixel power line VDD(VDDL). The subpixels provided with the plurality of third anode electrodes 123 may be at least one of the first subpixel P1 and the third subpixel P3. For example, the subpixels provided with the plurality of third anode electrodes 123 may be the first subpixels P1. For another example, the subpixels provided with the plurality of third anode electrodes 123 may be the third subpixels P3. For other example, the subpixels provided with the plurality of third anode electrodes 123 may be the first subpixels P1 and the third subpixels P3. At this time, the first subpixels P1 and the third subpixels P3 may alternately be disposed over the pixel power line VDD(VDDL).

The second anode electrode 122 may be disposed between the first anode electrode 121 and the third anode electrode 123. In detail, the second anode electrode 122 may be disposed over the gate line GL provided between the first intersection area IA1 and the second intersection area IA2.

The first anode electrode 121 and the third anode electrode 123 may have shapes different from a shape of the second anode electrode 122.

In detail, the first anode electrode 121, as shown in FIG. 4, may include a first portion 121a and a second portion 121b. In one embodiment, the first anode electrode 121 may further include a third portion 121c.

The first portion 121a of the first anode electrode 121 may be disposed to overlap the first intersection area IA1 where the common power line VSS(VSSL) and the gate line GL cross each other. For example, the first portion 121a of the first anode electrode 121 may have a rectangular shape but is not limited thereto. The first portion 121a of the first anode electrode 121 may be formed in various shapes such as a circle, a semi-circle, and a polygonal shape.

The second portion 121b of the first anode electrode 121 may be protruded from one side S1-1 of the first portion 121a. At this time, the second portion 121b of the first anode electrode 121 may be disposed over the common power line VSS(VSSL). That is, one side of the first portion 121a may correspond to a side crossing the common power line VSS(VSSL). The second portion 121b of the first anode electrode 121 may be protruded toward a direction where the common power line VSS(VSSL) is extended, that is, a second direction (Y axis direction).

The third portion 121c of the first anode electrode 121 may be protruded from the other side of the first portion 121a. At this time, the third portion 121c of the first anode electrode 121 may be disposed over the common power line VSS(VSSL). That is, the other side of the first portion 121a may correspond to a side crossing the common power line VSS(VSSL) and facing one side. The third portion 121c of the first anode electrode 121 may be protruded toward a direction where the common power line VSS(VSSL) is extended, that is, a second direction (Y axis direction).

The third portion 121c of the first anode electrode 121 and the second portion 121b of the first anode electrode 121 may have symmetric shapes by interposing the first portion 121a of the first anode electrode 121.

The third anode electrode 123 may substantially have the same shape as that of the first anode electrode 121. In detail, the third anode electrode 123 may include a first portion 123a and a second portion 123b in the same manner as the first anode electrode 121. In one embodiment, the third anode electrode 123 may further include a third portion 123c.

The first portion 123a of the third anode electrode 123 may be disposed to overlap the second intersection area IA2 where the pixel power line VDD(VDDL) and the gate line GL cross each other. For example, the first portion 123a of the third anode electrode 123 may have a rectangular shape but is not limited thereto. The first portion 123a of the third anode electrode 123 may be formed in various shapes such as a circle, a semi-circle, and a polygonal shape.

The second portion 123b of the third anode electrode 123 may be protruded from one side of the first portion 123a. At this time, the second portion 123b of the third anode electrode 123 may be disposed over the pixel power line VDD(VDDL). That is, one side of the first portion 123a may correspond to a side crossing the pixel power line VDD(VDDL). The second portion 123b of the third anode electrode 123 may be protruded toward a direction where the pixel power line VDD(VDDL) is extended, that is, a second direction (Y axis direction).

The third portion 123c of the third anode electrode 123 may be protruded from the other side of the first portion 123a. At this time, the third portion 123c of the third anode electrode 123 may be disposed over the pixel power line VDD(VDDL). That is, the other side of the first portion 123a may correspond to a side crossing the pixel power line VDD(VDDL) and facing one side. The third portion 123c of the third anode electrode 123 may be protruded toward a direction where the pixel power line VDD(VDDL) is extended, that is, a second direction (Y axis direction).

The third portion 123c of the third anode electrode 123 and the second portion 123b of the third anode electrode 123 may have symmetric shapes by interposing the first portion 131a of the third anode electrode 123.

In the transparent display panel 110 according to one embodiment of the present disclosure, the first anode electrode 121 and the third anode electrode 123 may include first portions 121a and 123a, and second portions 121b and 123b and third portions 121c and 123c, which are protruded from the first portions 121a and 123a in a second direction (Y axis direction).

At this time, the second portions 121b and 123b and the third portions 121c and 123c may overlay a plurality of metal lines provided therebelow and extended in a second direction (Y axis direction). The plurality of metal lines may include power lines PL such as the common power line VSS(VSSL) or the pixel power line VDD(VDDL), data lines DL1 and DL2, and reference lines REFL1 and REFL2. The data lines DL1 and DL2 and the reference lines REFL1 and REFL2, as shown in FIG. 6, may be disposed to be spaced apart from each other on the same layer. In detail, the data lines DL1 and DL2 and the reference lines REFL1 and REFL2 may be disposed to be spaced apart from each other on the same layer as the source electrode SE and the drain electrode DE of the driving transistor T. The common power line VSS(VSSL) or the pixel power line VDD(VDDL) may be disposed on the same layer as the anode auxiliary electrode 115.

If these metal lines are disposed in parallel to be spaced apart from each other, a slit, specifically a linear or rectangular shape may be formed between the metal lines. If external light passes through the slit, diffraction may occur.

Diffraction may mean that interference occurs in spherical waves after plane waves are changed to the spherical waves as light passes through the slit. Therefore, as interpolation interference and destructive interference occur in the spherical waves, the external light that has passed through the slit may have irregular light intensity. As a result, definition of an object or image arranged at an opposite side of the transparent display panel 110 may be reduced.

In the transparent display panel 110 according to one embodiment of the present disclosure, the second portions 121b and 123b and the third portions 121c and 123c protruded from the first portions 121a and 123a in the second direction (Y axis direction) may be formed in the first anode electrode 121 and the third anode electrode 123 to overlay the plurality of metal lines provided below the first anode electrode 121 and the third anode electrode 123 if possible. Therefore, the transparent display panel 110 according to one embodiment of the present disclosure may prevent diffraction from occurring due to the plurality of metal lines.

Moreover, the transparent display panel 110 according to one embodiment of the present disclosure may increase an area of a light emission area EA by forming the second portion 121b and the third portion 121c in the first anode electrode 121 and the third anode electrode 123.

Also, in the transparent display panel 110 according to one embodiment of the present disclosure, the second portion 121b and the third portion 121c may have minimum widths that may overlay the plurality of metal lines.

Meanwhile, in some embodiments, the second anode electrode 122 may be provided with only the first portion 122a. The first portion 122a of the second anode electrode 122 may have a rectangular shape but is not limited thereto. The first portion 122a of the second anode electrode 122 may be formed in various shapes such as a circle, a semi-circle, and a polygonal shape.

Meanwhile, the second anode electrode 122 is not provided with a portion protruded from the first portion 122a unlike the first anode electrode 121 and the third anode electrode 123. The second anode electrode 122 is overlapped with the gate line GL extended in the first direction (X axis direction), and is not overlapped with the common power line VSS(VSSL) or the pixel power line VDD(VDDL) extended in the second direction (Y axis direction). Therefore, if the second anode electrode 122 forms the portion protruded from the first portion 122a in the second direction (Y axis direction), the non-transmissive area NTA may be increased unnecessarily, and the area of the transmissive area TA may be reduced. Therefore, in some embodiments, it is beneficial to provide the second anode electrode 122 with only the first portion 122a.

Consequently, the second anode electrode 122 may have an area smaller than those of the first anode electrode 121 and the third anode electrode 123. Therefore, the second subpixel P2 provided with the second anode electrode 122 may have a light emission area smaller than those of the first subpixel P1 and the third subpixel P3 provided with the first anode electrode 121 or the third anode electrode 123. The second subpixel P2 may be a red subpixel emitting red light. Generally, since the red subpixel has lifetime more excellent than a green subpixel and a blue subpixel, even though the red subpixel is formed with a small area, lifetime of the transparent display panel 110 may not be reduced.

The first anode electrode 121, the second anode electrode 122 and the third anode electrode 123 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

A bank 125 may be provided over a second planarization layer PLN2. Also, the bank 125 may be provided among the anode electrodes 120. In detail, the bank 125 may be provided among the first anode electrode 121, the second anode electrode 122 and the third anode electrode 123, which are disposed to adjoin one another in the first direction (X axis direction). Also, the bank 125 may be provided among a plurality of first anode electrodes 121 disposed over the common power line VSS(VSSL) along the second direction (Y axis direction). Also, the bank 125 may be provided among a plurality of third anode electrodes 123 disposed over the pixel power line VDD(VDDL) along the second direction (Y axis direction)

The bank 125 may be formed to cover each edge of the first anode electrode 121, the second anode electrode 122 and the third anode electrode 123 and partially expose each of the first anode electrode 121, the second anode electrode 122 and the third anode electrode 123. Therefore, the bank 125 may prevent light emitting efficiency from being deteriorated due to a current concentrated on the ends of the first anode electrode 121, the second anode electrode 122 and the third anode electrode 123. The bank 125, in some embodiments, may be provided in only the non-transmissive area NTA, and may not be provided in the transmissive area TA.

In some embodiments, the bank 125 may respectively define emission areas EA1, EA2, and EA3 of the subpixels P1, P2 and P3. Each of the emission areas EA1, EA2 and EA3 of the subpixels P1, P2 and P3 indicates an area where the anode electrode 120, the light emitting layer 130 and the cathode electrode 140 are sequentially deposited and then holes from the anode electrode 120 and electrons from the cathode electrode 140 are combined with each other in the light emitting layer 130 to emit light. In this case, the area where the bank 125 is not formed and the anode electrode 120 is exposed may be an emission area EA, and the other area may be a non-emission area NEA.

The bank 125 may be provided in only the non-transmissive area NTA, and may not be provided in the transmissive area TA. That is, the bank 125 may include a second opening area OA2 overlapped with the transmissive area TA.

The second opening area OA2 provided in the bank 125 may be smaller than the first opening area OA1 provided in at least one inorganic insulating film and at least one organic insulating film. The first opening area OA1 may be overlapped with all areas of the second opening area OA2.

Since the second opening area OA2 provided in the bank 125 is smaller than the first opening area OA1 provided in at least one inorganic insulating film and at least one organic insulating film, the bank 125, as shown in FIGS. 6 and 7, may overlay sides of at least one inorganic insulating film and sides of at least one organic insulating film, which are exposed to the first opening area OA1.

For example, the bank 125 may overlay a side of the first inter-layer dielectric film ILD1, a side of the second inter-layer dielectric film ILD2, a side of the first planarization film PLN1, and a side of the second planarization film PLN2, which are exposed from the first opening area OA1.

The bank 125 may be formed of an organic film, for example, acryl based material, epoxy based material, phenolic based material, polyamide based material, polyimide based material, etc. Also, the bank 125 may include a material that absorbs light, for example, a black dye that absorbs light of a visible light wavelength range.

In the transparent display panel 110 according to one embodiment of the present disclosure, the bank 125 made of a material that absorbs light may overlay the side of the first inter-layer dielectric film ILD1, the side of the second inter-layer dielectric film ILD2, the side of the first planarization film PLN1 and the side of the second planarization film PLN2, which are exposed from the first opening area OA1. In the transparent display panel 110 according to one embodiment of the present disclosure, the bank 125 may absorb externally incident light headed for any one of the side of the first inter-layer dielectric film ILD1, the side of the second inter-layer dielectric film ILD2, the side of the first planarization film PLN1 and the side of the second planarization film PLN2, which are exposed from the first opening area OA1. Therefore, the transparent display panel 110 according to one embodiment of the present disclosure may prevent some of the externally incident light from being refracted from any one of the side of the first inter-layer dielectric film ILD1, the side of the second inter-layer dielectric film ILD2, the side of the first planarization film PLN1 and the side of the second planarization film PLN2, which are exposed from the first opening area OA1.

The bank 125 may define the non-transmissive area NTA in the display area DA as well as the light emission area EA. In detail, the second opening area OA2 of the bank 125 may be the transmissive area TA, and the other area may be the non-transmissive area NTA.

Meanwhile, in the transparent display panel 110 according to one embodiment of the present disclosure, since the bank 125 absorbs light, the bank 125 serves as a black matrix of the related art. Therefore, the bank 125 may be provided among the subpixels P1, P2 and P3 to prevent color mixture from occurring among the adjacent subpixels P1, P2 and P3. Also, the bank 125 may prevent externally incident light from being reflected toward a plurality of lines provided among the subpixels P1, P2 and P3, for example, the gate lines, the data lines, the pixel power lines, the common power lines, the reference lines, etc.

Therefore, in the transparent display panel 110 according to one embodiment of the present disclosure, since a black matrix is not provided among the color filters CF1, CF2 and CF3, the process may be simplified.

The spacer 127 may be provided over the bank 125. In detail, the spacer 127 may be provided over the bank 125 disposed between the plurality of first anode electrodes 121. At this time, at least a part of the spacer 127, as shown in FIG. 3, may be overlapped with ends of the first anode electrodes 121 disposed to adjoin each other.

Also, the spacer 127 may be provided over the bank 125 disposed between the plurality of third anode electrodes 123. At this time, at least a part of the spacer 127, as shown in FIG. 3, may be overlapped with ends of the third anode electrodes 123 disposed to adjoin each other.

The spacer 127 may not be provided over the bank 125 disposed among the first anode electrode 121, the second anode electrode 122 and the third anode electrode 123. The spaced distances among the first anode electrode 121, the second anode electrode 122 and the third anode electrode 123 may be formed to be short. If the spacer 127 is formed among the first anode electrode 121, the second anode electrode 122 and the third anode electrode 123, the spaced distances among the first anode electrode 121, the second anode electrode 122 and the third anode electrode 123 may be increased. For this reason, the area of the emission area EA in the non-transmissive area NTA may be reduced.

On the other hand, the spaced distance between the first anode electrodes 121 disposed over the common power line VSS(VSSL) along the second direction (Y axis direction) may be relatively long. Therefore, even though the spacer 127 is formed between the first anode electrodes 121, the spaced distance between the first anode electrodes 121 may not be increased. Therefore, the spacer 127 may be formed without decrease of the area of the emission area EA in the non-transmissive area NTA.

Also, the spaced distance between the third anode electrodes 123 disposed over the pixel power line VDD(VDDL) along the second direction (Y axis direction) may be relatively long. Therefore, even though the spacer 127 is formed between the third anode electrodes 123, the spaced distance between the third anode electrodes 123 may not be increased. Therefore, the spacer 127 may be formed without decrease of the area of the emission area EA in the non-transmissive area NTA.

The spacer 127 may be disposed between the transmissive areas TA disposed to adjoin each other in the first direction (X axis direction). The spacer 127 may be formed with a width WS narrower than a width WNTA of the non-transmissive area NTA. Therefore, since the spacer 127 is not overlapped with the transmissive area TA, the spacer 127 may not affect transmittance of the transmissive area TA.

In the transparent display panel 110 according to one embodiment of the present disclosure, the spacer 127 may be formed without decrease of the area of the emission area EA. Also, in the transparent display panel 110 according to one embodiment of the present disclosure, the mask may be disposed over the spacer 127 in the process of forming the light emitting layer, whereby the light emitting layer may be formed to be accurately patterned. Also, in the transparent display panel 110 according to one embodiment of the present disclosure, the elements formed over the first substrate 111 may be prevented from being damaged by the mask.

The spacer 127 may be formed of an organic film, for example, acryl resin, epoxy resin, phenolic resin, polyamide resin, polyimide resin, etc.

The organic light emitting layer 130 may be on the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

The organic light emitting layer 130, as shown in FIG. 5, may include light emitting layers each of which is formed for each of the subpixels P1, P2 and P3. For example, a green light emitting layer 131 emitting green light may be formed in the first subpixel P1, a red light emitting layer 132 emitting red light may be formed in the second subpixel P2, and a blue light emitting layer 133 emitting blue light may be formed in the third subpixel P3. In this case, the light emitting layers of the organic light emitting layer 130 are not formed in the transmissive area TA.

The cathode electrode 140 may be on the organic light emitting layer 130 and the bank 125. The cathode electrode 140 may be provided in the transmissive area TA as well as the non-transmissive area NTA that includes the emission area EA, but is not limited thereto. The cathode electrode 140, in some embodiments, may be provided in only the non-transmissive area NTA that includes the emission area EA, and may not be provided in the transmissive area TA to improve transmittance.

The cathode electrode 140 may be a common layer commonly formed for the subpixels P1, P2 and P3 to apply the same voltage to the subpixels P1, P2 and P3. The cathode electrode 140 may be formed of a transparent conductive material (TCO) such as ITO and IZO, which can transmit light, or may be formed of a semi-transmissive conductive material such as Mg, Ag, or alloy of Mg and Ag. If the cathode electrode 140 is formed of a semi-transmissive conductive material, emission efficiency may be enhanced by micro cavity.

An encapsulation layer 150 may be on the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic film and at least one organic film.

Meanwhile, although not shown in FIG. 5, a capping layer may additionally be formed between the cathode electrode 140 and the encapsulation layer 150.

A color filter layer 170 may be provided over the encapsulation layer 150. The color filter layer 170 may be provided over one surface of the second substrate 112 that faces the first substrate 111. In this case, the first substrate 111 provided with the encapsulation layer 150 and the second substrate 112 provided with the color filter layer 170 may be bonded to each other by an adhesive layer 160. At this time, the adhesive layer 160 may be an optically clear resin (OCR) layer or an optically clear adhesive (OCA) film.

The color filter layer 170 may be formed to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

The transparent display panel 110 according to one embodiment of the present disclosure is characterized in that a polarizer is not used, and the color filter layer 170 is formed in the second substrate 112. If the polarizer is attached to the transparent display panel 110, transmittance of the transparent display panel 110 is reduced by the polarizer. Meanwhile, if the polarizer is not attached to the transparent display panel 110, a problem occurs in that externally incident light is reflected towards the electrodes.

Since a polarizer is not attached to the transparent display panel 110 according to one embodiment of the present disclosure, transmittance may be prevented from being reduced. Also, in the transparent display panel 110 according to one embodiment of the present disclosure, the color filter layer 170 may be formed in the second substrate 112 to partially absorb externally incident light, thereby preventing the incident light from being reflected toward the electrodes. That is, the transparent display panel 110 according to one embodiment of the present disclosure may reduce external light reflectivity without reducing transmittance.

Meanwhile, the color filter layer 170 may directly be formed over the encapsulation film 150. The color filter layer 170 may be formed to adjoin an upper surface of the encapsulation film 150.

Figure 12A:
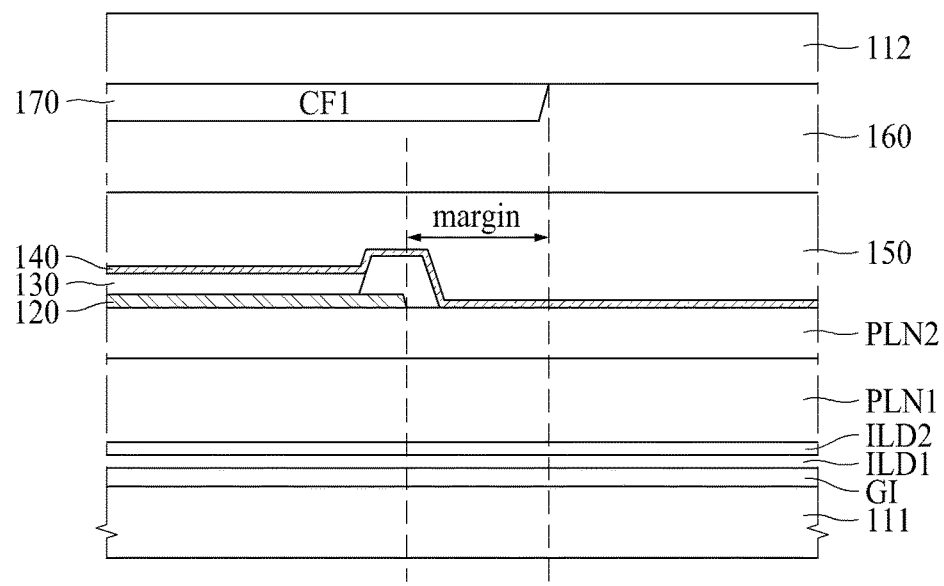
FIG. 12A is a schematic cross-sectional view illustrating a formation area of a color filter layer in a transparent display panel of the related art.

The color filter layer 170, as shown in FIG. 12A, may be provided over one surface of the second substrate 112. The second substrate 112 provided with the color filter layer 170 may be bonded to the first substrate 111 by an adhesive layer 160. In this case, the color filter layer 170 should be formed considering a bonding margin of the first substrate 111 and the second substrate 112. An area of the color filter layer 170 is unnecessarily increased, whereby the transmissive area TA may be reduced.

Figure 12B:
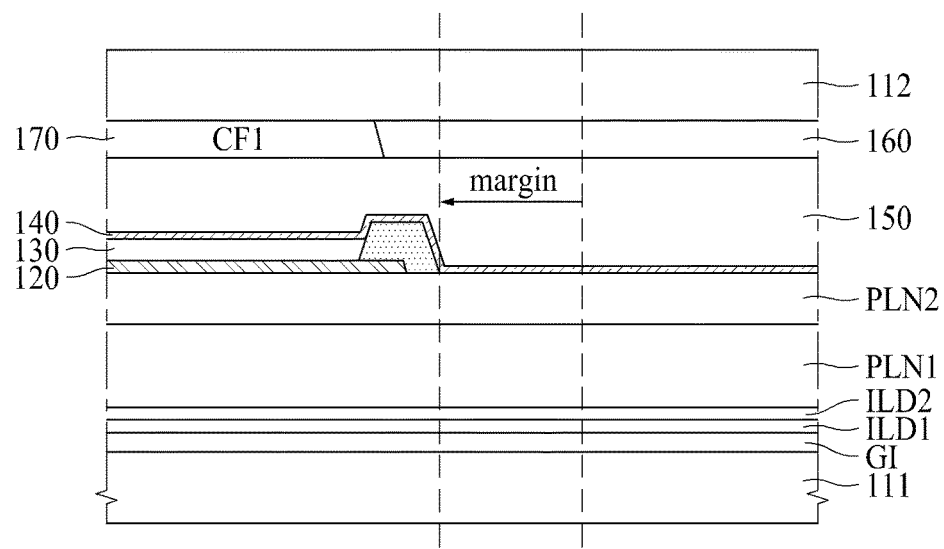
FIG. 12B is a schematic cross-sectional view illustrating a formation area of a color filter layer in a transparent display panel according to one embodiment of the present disclosure.

Meanwhile, the bonding margin of the first substrate 111 and the second substrate 112 may not be considered as shown in FIG. 12B in the process of directly forming the color filter layer 170 over the encapsulation film 150. Therefore, in the transparent display panel 110 according to one embodiment of the present disclosure, each of the first color filter CF1, the second color filter CF2 and the third color filter CF3 may be formed with a minimum area that overlays light emission areas EA1, EA2 and EA3 of the subpixels P1, P2 and P3.

In detail, each of the first color filter CF1, the second color filter CF2 and the third color filter CF3 may be provided to overlay the light emission areas EA1, EA2 and EA3 of the subpixels P1, P2 and P3. The first color filter CF1 may be provided to overlay the first light emission area EA1 of the first subpixel P1. The second color filter CF2 may be provided to overlay the second light emission area EA2 of the second subpixel P2. The third color filter CF3 may be provided to overlay the third light emission area EA3 of the third subpixel P3.

A distance between the transmissive area TA and an end of each of the first color filter CF1, the second color filter CF2 and the third color filter CF3 may be longer than a distance between the transmissive area TA and an end of the bank 125. If the bank 125 is made of a material that absorbs light, the end of the bank 125 may be matched with the end of the non-transmissive area NTA. Each end of the first color filter CF1, the second color filter CF2 and the third color filter CF3 may be formed more inwardly than the end of the bank 125.

Consequently, in the transparent display panel 110 according to one embodiment of the present disclosure, the area of the non-transmissive area NTA is not increased unnecessarily by the first color filter CF1, the second color filter CF2 and the third color filter CF3. In the transparent display panel 110 according to one embodiment of the present disclosure, as shown in FIG. 12B, the area of the transmissive area TA may be increased as much as the bonding margin of the first and second substrates 111 and 112 in comparison with the transparent display panel of the related art provided with the color filter layer 170 over the second substrate 112. Supposing that the bonding margin is 4 um, transparency in the transparent display panel 110 according to one embodiment of the present disclosure shown in FIG. 12B may be increased as much as 3% in comparison with the transparent display panel of the related art shown in FIG. 12A.

The first substrate 111 provided with the color filter layer 170 may be bonded to the second substrate 112 by a separate adhesive layer 160. At this time, the adhesive layer 160 may be an optically clear resin (OCR) layer or an optically clear adhesive (OCA) film.

Although FIG. 7 shows that the first color filter CF1, the second color filter CF2 and the third color filter CF3 are provided over the encapsulation film 150, the present disclosure is not limited to the example of FIG. 7.

In another embodiment, the first color filter CF1, the second color filter CF2 and the third color filter CF3 may be omitted as shown in FIG. 8. In this case, the anode electrode 120 may be formed of a low reflective metal material to reduce reflectance. The low reflective metal material may be a metal material of which reflectance is 60% or less.

The anode electrode 120 may be made of a deposited structure (ITO/Ag alloy/ITO) of Ag alloy and ITO. The electrode made of ITO/Ag alloy/ITO, as shown in FIG. 9, has a reflectance of 60% or more in a visible ray area. If the anode electrode 120 is made of a metal material of high reflectance such as ITO/Ag alloy/ITO, a problem occurs in that most of externally incident light may be reflected by the anode electrode 120 formed of ITO/Ag ally/ITO and then emitted to the outside.

On the other hand, the electrode made of Mo and the electrode made of Ti/Al/Ti, as shown in FIG. 9, have a reflectance of 60% or less in a visible ray area. In the transparent display panel 110 according to one embodiment of the present disclosure, the color filters CF1, CF2 and CF3 may be omitted and the anode electrode 120 may be formed of a low reflective metal material, whereby external light reflectance may be prevented from being increased.

Meanwhile, although FIG. 7 shows that the encapsulation film 150 is directly formed over the cathode electrode 140, the present disclosure is not limited to the example of FIG. 7.

In another embodiment, a step difference compensation film 155 may further be provided between the cathode electrode 140 and the encapsulation film 150 as shown in FIG. 10. The step difference compensation film 155 may be provided over the cathode electrode 140, whereby a step difference between the transmissive area TA and the non-transmissive area NTA may be compensated. For example, by having a step difference compensation film 155 on at least some portions of the cathode electrode 140 in the transmissive area TA, the height difference between the transmissive area TA and the non-transmissive area NTA is compensated.

In detail, the step difference compensation film 155 may be provided in the transmissive area TA, and may expose at least a portion of the cathode electrode 140 provided in the non-transmissive area NTA. At this time, the step difference compensation film 155, as shown in FIG. 10, may be provided such that an upper height may correspond to an upper height of the second planarization film PLN2, but is not limited thereto. For example, the step difference compensation film 155 may be provided such that an upper surface of the step difference compensation film 155 and an upper surface of the second planarization film PLN2 are at a substantially same height.

In the transparent display panel 110 according to one embodiment of the present disclosure, at least one inorganic insulating film provided between the first substrate 111 and the anode electrode 120, for example, the first and second inter-layer dielectric films ILD1 and ILD2 are provided in the non-transmissive area NTA but are not provided in the transmissive area TA. Also, in the transparent display panel 110 according to one embodiment of the present disclosure, at least one organic insulating film provided between the first substrate 111 and the anode electrode 120, for example, the first and second planarization films PLN1 and PLN2 are provided in the non-transmissive area NTA but are not provided in the transmissive area TA.

Therefore, the transparent display panel 110 according to one embodiment of the present disclosure may have a great step difference in the transmissive area TA and the non-transmissive area NTA. A crack may occur in the first inorganic film 151 constituting the encapsulation film 150 due to a great step difference between the transmissive area TA and the non-transmissive area NTA. Also, water may be permeated into the light emitting diode through the crack occurring in the first inorganic film 151, whereby the light emitting diode may be damaged.

In order to prevent the crack from occurring in the first inorganic film 151, in the transparent display panel 110 according to one embodiment of the present disclosure, the step difference compensation film 155, which may compensate for the step difference between the transmissive area TA and the non-transmissive area NTA, may be formed over the cathode electrode 140 before the first inorganic film 151 is formed. The step difference compensation film 155 may be provided in the transmissive area TA to reduce the step difference between the transmissive area TA and the non-transmissive area NTA.

The step difference compensation film 155 may be made of a transparent organic material. For example, the step difference compensation film 155 may be made of a transparent polyimide. Since the transparent polyimide has high light transmittance, even though the step difference compensation film 155 is disposed, light transmittance of the transmissive area TA may be not be reduced. Since transparent polyimide is formed after the bank 125 is formed, the transparent polyimide may be hardened at a low temperature, and may make sure of high transparency.

Meanwhile, the material of the step difference compensation film 155 may be different from that of the first and second planarization films PLN1 and PLN2. Since the step difference compensation film 155 is provided in the transmissive area TA, the step difference compensation film 155 may be made of a material having high light transmittance, for example, a transparent polyimide. On the other hand, the first and second planarization films PLN1 and PLN2 may be made of a material having excellent planarization characteristic and having no deformation even in case of a high temperature environment.

The transparent polyimide has a glass transition temperature Tg which is relatively lower than that of an opaque polyimide. At this time, the transparent polyimide and the opaque polyimide may be identified from each other by a yellow index. If the first and second planarization films PLN1 and PLN2 are formed of a transparent polyimide, the process of forming the light emitting diode is performed and the first and second planarization films PLN1 and PLN2 may be exposed to a high temperature environment. Deformation and stress may occur in the first and second planarization films PLN1 and PLN2 made of a transparent polyimide due to occurrence of vibration of molecules in the middle of the process.

In some embodiments, the first and second planarization films PLN1 and PLN2 are formed of the opaque polyimide having a glass transition temperature higher than that of the transparent polyimide to prevent deformation and stress from occurring. Alternatively, the first and second planarization films PLN1 and PLN2 may be made of an acryl based material that includes photo acryl (PAC) having excellent planarization characteristic. Since the opaque polyimide or photo acryl (PAC) has a high yellow index due to material characteristic, it is beneficial that the opaque polyimide or photo acryl (PAC) is not provided in the transmissive area TA.

In the transparent display panel 110 according to one embodiment of the present disclosure, the step difference compensation film 155 is formed, whereby the crack may be prevented from occurring in the first inorganic film 151 constituting the encapsulation film 150.

Meanwhile, although FIG. 7 shows that the planarization film provided between the anode electrode 120 and the first substrate 111 includes a double structure that includes the first planarization film PLN1 and the second planarization film PLN2, the present disclosure is not limited to this example of FIG. 7. In another embodiment, the planarization film, as shown in FIG. 11, may have a single layered structure that includes the first planarization film PLN1. In this case, the end of the first planarization film PLN1 may be formed to be more protruded than the end of the anode electrode 120.

Also, although FIG. 7 shows that the first inter-layer dielectric film ILD1 and the second inter-layer dielectric film ILD2 are provided between the first planarization film PLN1 and the first substrate 111, the present disclosure is not limited to this example of FIG. 7. In another embodiment, the first inter-layer dielectric film ILD1 only may be provided between the first planarization film PLN1 and the first substrate 111.

Referring to FIG. 2 again, the non-display area NDA may be provided with a pad area PA in which pads PAD are disposed, and at least one gate driver 205.

In detail, the non-display area NDA may include a first non-display area NDA1 in which the pads PAD are disposed, a second non-display area NDA2 disposed in parallel with the first non-display area NDA1 by interposing the display area DA, and third and fourth non-display areas NDA3 and NDA4 connecting the first non-display area NDA1 with the second non-display area NDA2.

The gate driver 205 is connected to the gate lines GL and supplies gate signals to the gate lines GL. The gate driver 205 may be disposed in at least one of the fourth non-display area NDA4 and the third non-display area NDA3 in a gate drive in panel (GIP) type. For example, as shown in FIG. 2, the gate driver 205 may be formed in the fourth non-display area NDA4, and another gate driver 205 may be formed in the third non-display area NDA3, but is not limited thereto.

The gate driver 205 may be formed in any one of the fourth non-display area NDA4 and the third non-display area NDA3.

The pads PAD may include a first pad VDDP, a second pad VSSP, a third pad VREFP, and a fourth pad DP, and may be provided in the first non-display area NDA1. That is, the first non-display area NDA1 may include a pad area PA.

The transparent display panel 110 according to one embodiment of the present disclosure may include a plurality of signal lines connected with the subpixels P1, P2 and P3 provided in the display area DA. For example, the transparent display panel 110 according to one embodiment of the present disclosure may include a pixel power line VDD, a common power line VSS and a reference line VREF.

The pixel power line VDD may supply a first power source to the driving transistor T of each of the subpixels P1, P2 and P3 provided in the display area DA.

Accordingly, in some embodiments, the pixel power line VDD may include a first pixel power line VDD1 provided in a first non-display area NDA1, a second pixel power line VDD2 provided in a second non-display area NDA2, and a plurality of third pixel power lines VDDL connecting the first pixel power line VDD1 with the second pixel power line VDD2.

The common power line VSS may supply a second power source to the cathode electrode 140 of the subpixels P1, P2 and P3 provided in the display area DA. At this time, the second power source may be a common power source commonly supplied to the subpixels P1, P2 and P3.

Accordingly, in some embodiments, the common power line VSS may include a first common power line VSS1 provided in the first non-display area NDA1, a second common power line VSS2 provided in the second non-display area NDA2, and a plurality of third common power lines VSSL connecting the first common power line VSS1 with the second common power line VSS2.

The reference line VREF may supply an initialization voltage (or sensing voltage) to the driving transistor T of each of the subpixels P1, P2 and P3 provided in the display area DA.

Accordingly, in some embodiments, the reference line VREF may include a first reference line VREF1 provided in the first non-display area NDA1, and a plurality of second reference lines VREFL disposed in the display area DA.

The pads PAD, the first pixel power line VDD1, the first common power line VSS1, the first reference line VREF1, third pixel power lines VDDL, and third common power lines VSSL may be provided in the first non-display area NDA1.

The first pixel power line VDD1 may be provided to be extended in the first non-display area NDA1, specifically between the pad area PA and the display area DA in a first direction (X axis direction). The first pixel power line VDD1 may be connected with the first pad VDDP in the first non-display area NDA1, and may be supplied with a first power source from the first pad VDDP. The first pad VDDP may be extended in a second direction (Y axis direction), and may be connected with the first pixel power line VDD1.

Also, the first pixel power line VDD1 may be connected with a plurality of third pixel power lines VDDL disposed in the display area DA, and may supply the first power source to the driving transistor T of each of the subpixels P1, P2 and P3 through the plurality of third pixel power lines VDDL.

The third pixel power line VDDL may be provided between the transmissive areas TA in the display area DA, and thus may be connected with the driving transistor T of each of the subpixels P1, P2 and P3. The third pixel power line VDDL may be extended in the display area DA in a second direction (Y axis direction), and thus its one end may be connected with the first pixel power line VDD1.

The first common power line VSS1 may be provided to be extended in the first non-display area NDA1, specifically between the first pixel power line VDD1 and the display area DA in a first direction (X axis direction). The first common power line VSS1 may be connected with the second pad VSSP in the first non-display area NDA1, and may be supplied with a second power source from the second pad VSSP. Also, the first common power line VSS1 may be connected with the plurality of third common power lines VSSL disposed in the display area DA, and may supply the second power source to the cathode electrode 140 of the subpixels P1, P2 and P3 through the plurality of third common power lines VSSL.

The third common power line VSSL is provided between the transmissive areas TA in the display area DA. At this time, the transparent display panel 110 according to one embodiment of the present disclosure may reduce or minimize the non-transmissive area NTA in the display area DA by alternately disposing the third common power line VSSL and the third pixel power line VDDL between the transmissive areas TA. Therefore, the transparent display panel 110 according to one embodiment of the present disclosure may enhance transmittance by increasing the transmissive area TA.

Meanwhile, the third common power line VSSL may be extended in the display area DA in a second direction (Y axis direction), and thus its one end may be connected with the first common power line VSS1.

The first reference line VREF1 may be provided to be extended in the first non-display area NDA1, specifically between the first pixel power line VDD1 and the first common power line VSS1 in a first direction (X axis direction). The first reference line VREF1 may be connected with the third pad VREFP in the first non-display area NDA1, and may be supplied with the initialization voltage (or sensing voltage) from the third pad VREFP. Also, the first reference line VREF1 may be connected with the plurality of second reference lines VREFL disposed in the display area DA, and may supply the initialization voltage (or sensing voltage) to the transistor T of each of the subpixels P1, P2 and P3 through the plurality of second reference lines VREFL.

Hereinafter, the second pixel power line VDD2 and the second common power line VSS2 provided in the second non-display area NDA2 will be described in more detail with reference to FIGS. 13 to 15.

Figure 13:
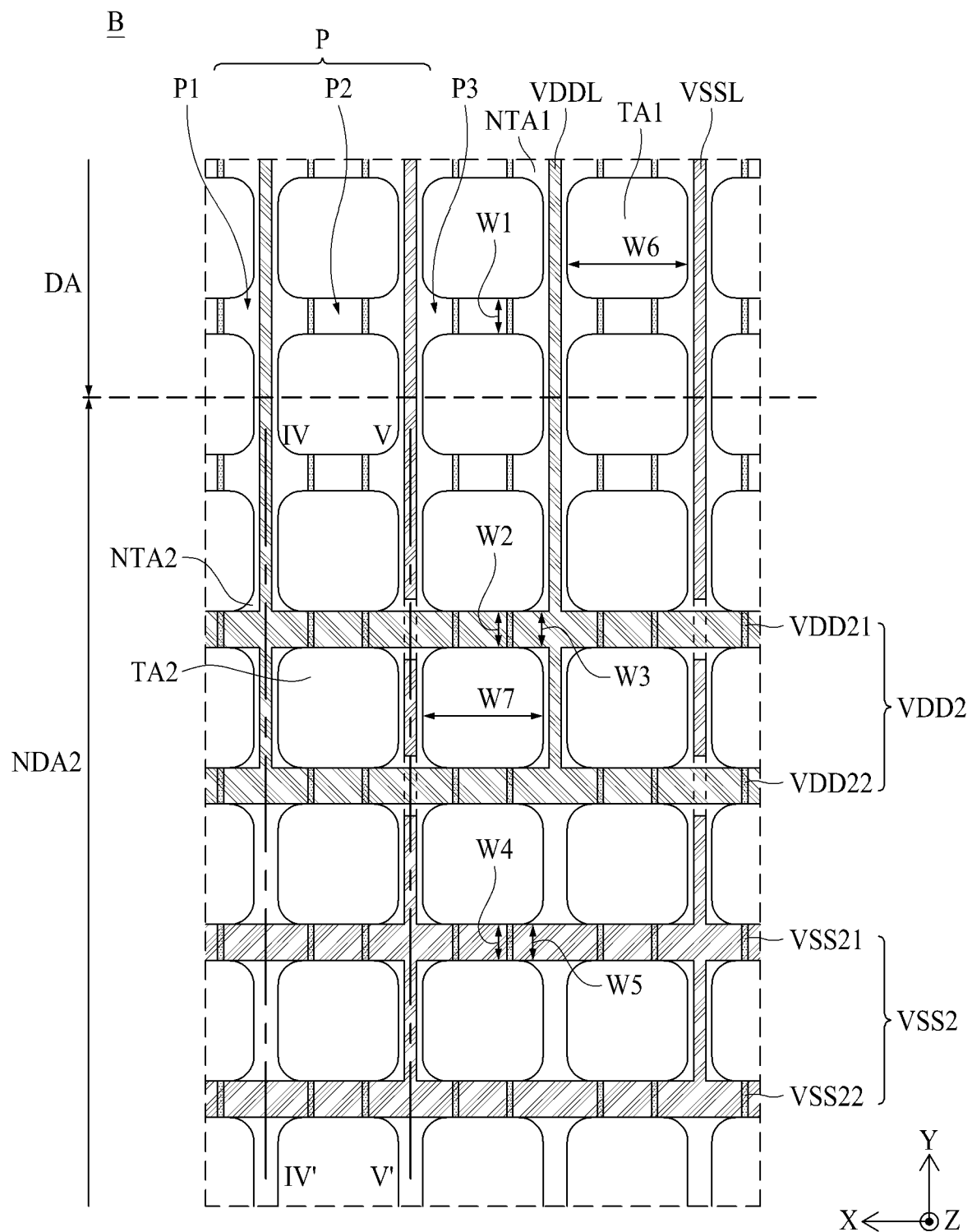
FIG. 13 is an enlarged view of an area B in FIG. 2.
Figure 14:
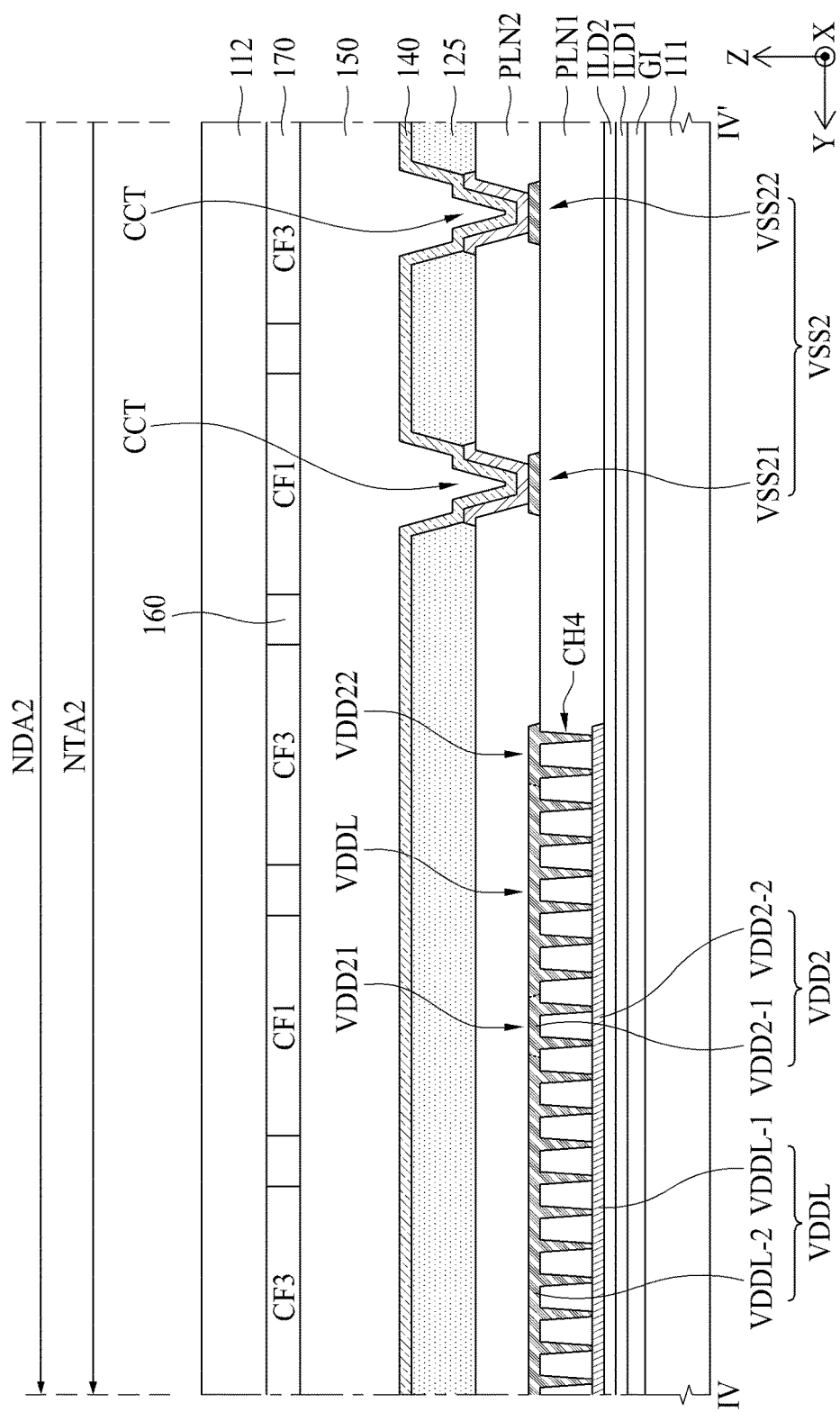
FIG. 14 is a cross-sectional view taken along line IV-IV' of FIG. 13.
Figure 15:
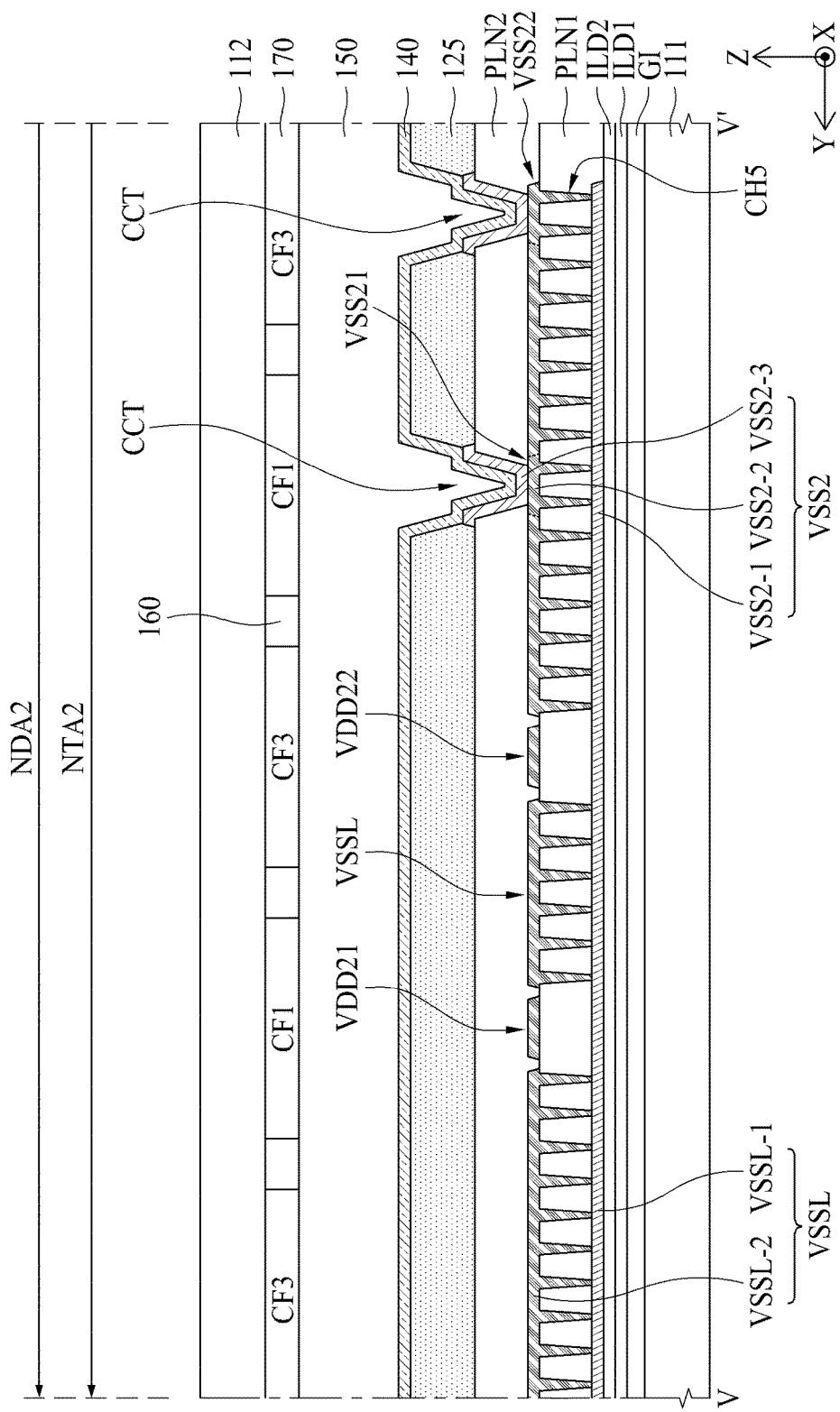
FIG. 15 is a cross-sectional view taken along line V-V' of FIG. 13.

FIG. 13 is an enlarged view of an area B in FIG. 2, FIG. 14 is a cross-sectional view taken along line IV-IV' of FIG. 13, FIG. 15 is a cross-sectional view taken along line V-V' of FIG. 13.

The display area DA, as shown in FIG. 13, may include first non-transmissive areas NTA1, and first transmissive areas TA1 provided between the first non-transmissive areas NTA1. The first transmissive area TA1 is an area through which most of externally incident light passes, and the first non-transmissive area NTA1 is an area through which most of externally incident light fails to transmit.

The first non-transmissive area NTA1 may be provided with third pixel power lines VDDL, third common power lines VSSL, reference lines, data lines, gate lines GL, and pixels P1, P2 and P3.

The gate lines GL may be extended in a first direction (X axis direction), and may cross the third pixel power lines VDDL, the third common power lines VSSL and the data lines in the display area DA.

The third pixel power lines VDDL, the third common power lines VSSL, and the data lines may be extended in a second direction (Y axis direction). At this time, the third pixel power lines VDDL and the third common power lines VSSL may alternately be disposed in the display area DA. The first transmissive area TA1 may be disposed between the third pixel power line VDDL and the third common power line VSSL.

The second non-display area NDA2 may include second non-transmissive areas NTA2, and second transmissive areas TA2 provided between the second non-transmissive areas NTA2. The second transmissive area TA2 is an area through which most of externally incident light passes as it is, and the second non-transmissive area NTA2 is an area through which most of externally incident light fails to transmit.

The second non-transmissive area NTA2 may be provided with second pixel power lines VDD2, second common power lines VSS2, third pixel power lines VDDL and third common power lines VSSL.

The second pixel power line VDD2 may be extended from the second non-display area NDA2 in a first direction (X axis direction). The second pixel power line may be provided in the second non-display area NDA2 in a plural number. The number of second pixel power lines may be, but not limited to, as shown in FIG. 13. The number of second pixel power lines VDD2 may be three or more.

One second pixel power line VDD21 is disposed to be spaced apart from the other second pixel power line VDD22. At this time, the second transmissive area TA2 may be provided between one second pixel power line VDD21 and the other second pixel power line VDD22.

The second transmissive area TA2 provided between one second pixel power line VDD21 and the other second pixel power line VDD22 may substantially have the same shape as that of the first transmissive area TA1 provided in the display area DA. In this case, the substantially same shape means that shapes on a plane have the same property. Sizes or rates of the shapes may be equal to or different from each other.

For example, the first transmissive area TA1 provided in the display area DA may have a rectangular shape, and may have a rounded corner but is not limited thereto. In this case, the second transmissive area TA2 may also have a rectangular shape, and may have a rounded corner.

In the second non-transmissive area NTA2 provided with one second pixel power line VDD21 and the other second pixel power line VDD22, a width W2 in a second direction perpendicular to a first direction may be equal to a width W1 in a second direction of the first non-transmissive area NTA1 provided in the display area DA.

Each of one second pixel power line VDD21 and the other second pixel power line VDD22 may be disposed in the second non-transmissive area NTA2. Therefore, each of one second pixel power line VDD21 and the other second pixel power line VDD22 may have a width W3 equal to the width W2 of the second non-transmissive area NTA2 or a width W3 narrower than the width W2 of the second non-transmissive area NTA2.

Consequently, the plurality of second pixel power lines VDD2 disposed in the second non-display area NDA2 may have a width W3 equal to the width W1 in the second direction of the first non-transmissive area NTA1 provided in the display area DA or a width W3 narrower than the width W1 in the second direction of the first non-transmissive area NTA1.

In the transparent display panel 110 according to one embodiment of the present disclosure, the second pixel power line VDD2 provided in the second non-display area NDA2 does not have a wide width. In the transparent display panel 110 according to one embodiment of the present disclosure, the width W3 of the second pixel power line VDD2 may be formed to be equal to or narrower than the width W1 of the first non-transmissive area NTA1 provided in the display area DA, whereby the wide second transmissive area TA2 may be obtained in the second non-display area NDA2.

Meanwhile, in the transparent display panel 110 according to one embodiment of the present disclosure, the second pixel power line VDD2 may be formed in a plural al number, whereby a total area of the second pixel power line VDD2 may be increased.

Moreover, in the transparent display panel 110 according to one embodiment of the present disclosure, the second pixel power line VDD2 may be formed of a plurality of metal layers to increase its total area.

In detail, the second pixel power line VDD2 may be provided with a plurality of metal layers. For example, the second pixel power line VDD2, as shown in FIG. 14, may include a first metal layer VDD2-1 and a second metal layer VDD2-2 provided over the first metal layer VDD2-1. The first metal layer VDD2-1 and the second metal layer VDD2-2 may partially be overlapped with each other, and may be connected with each other through a fourth contact hole CH4.

At this time, the first metal layer VDD2-1 of the second pixel power line VDD2 may be made of an opaque metal material of low resistance. For example, the first metal layer VDD2-1 of the second pixel power line VDD2 may be provided on the same layer as the source electrode SE and the drain electrode DE of the driving transistor T provided in the display area DA. The first metal layer VDD2-1 may be made of the same material as that of the source electrode SE and the drain electrode DE of the driving transistor T and may be formed simultaneously with them.

The second metal layer VDD2-2 of the second pixel power line VDD2 may be made of an opaque metal material of low resistance. For example, the second metal layer VDD2-2 of the second pixel power line VDD2 may be provided on the same layer as the anode auxiliary electrode 115 provided in the display area DA. The second metal layer VDD2-2 may be made of the same material as that of the anode auxiliary electrode 115 and may be formed simultaneously with the anode auxiliary electrode 115. In this case, the second metal layer VDD2-2 of the second pixel power line VDD2 may be connected to the first metal layer VDD2-1 through a plurality of fourth contact holes CH4 that pass through the first planarization film PLN1.

In the transparent display panel 110 according to one embodiment of the present disclosure, as each of the plurality of second pixel power lines VDD2 provided in the second non-display area NDA2 is provided with a double layer, a total area of the second pixel power line VDD2 may be increased. Therefore, in the transparent display panel 110 according to one embodiment of the present disclosure, even though the width W3 of the second pixel power line VDD2 is formed to be narrow, whereby resistance of the second pixel power line VDD2 may be prevented from being increased.

Also, in the transparent display panel 110 according to one embodiment of the present disclosure, as the second metal layer VDD2-2 of the second pixel power line VDD2 may be connected to the first metal layer VDD2-1 of the second pixel power line VDD2 through the plurality of fourth contact holes CH4, the first metal layer VDD2-1 and the second metal layer VDD2-2 may stably be connected with each other.

Each of the third pixel power lines VDDL may be extended from the display area DA in a second direction (Y axis direction) and connected with the second pixel power line VDD2. The third pixel power line VDDL may be connected to one second pixel power line VDD21 and the other second pixel power line VDD22. In detail, each of the third pixel power lines VDDL may be extended from the display area DA in a second direction (Y axis direction), and thus may be connected with one side of one second pixel power line VDD21. Also, each of the third pixel power lines VDDL may be extended from the other side of one second pixel power line VDD21 in a second direction (Y axis direction), and thus may be connected with one side of the other second pixel power line VDD22. Therefore, one second pixel power line VDD21, the other second pixel power line VDD22 and the third pixel power lines VDDL may electrically be connected with one another.

The third pixel power lines VDDL may be formed on the same layer as the second pixel power line VDD2 in the second non-display area NDA2. In detail, the third pixel power line VDDL may include a first metal layer VDDL-1 and a second metal layer VDDL-2 in the second non-display area NDA2. The first metal layer VDDL-1 of the third pixel power line VDDL may be extended from the first metal layer VDD2-1 of the second pixel power line VDD2, and the second metal layer VDDL-2 of the third pixel power line VDDL may be extended from the second metal layer VDD2-2 of the second pixel power line VDD2.

In some embodiments, the third pixel power lines VDDL may be extended from the display area DA to only an upper layer VDDL-2.

The second common power line VSS2 may be extended from the second non-display area NDA2 in a first direction (X axis direction). The second common power line VSS2 may be provided in the second non-display area NDA2 in a plural number. The number of second common power lines VSS2 may be, but not limited to, as shown in FIG. 13. The number of second common power lines VSS2 may be three or more.

One second common power line VSS21 is disposed to be spaced apart from the other second common power line VSS22. At this time, the second transmissive area TA2 may be provided between one second common power line VSS21 and the other second common power line VSS22.

The second transmissive area TA2 provided between one second common power line VSS21 and the other second common power line VSS22 may substantially have the same shape as that of the first transmissive area TA1 provided in the display area DA. In this case, the substantially same shape means that shapes on a plane have the same property. Sizes or rates of the shapes may be equal to or different from each other.

For example, the first transmissive area TA1 provided in the display area DA may have a rectangular shape, and may have a rounded corner but is not limited thereto. In this case, the second transmissive area TA2 may also have a rectangular shape, and may have a rounded corner.

In the second non-transmissive area NTA2 provided with one second common power line VSS21 and the other second common power line VS S22, a width W4 in a second direction perpendicular to a first direction may be equal to the width W1 in a second direction of the first non-transmissive area NTA1 provided in the display area DA.

Each of one second common power line VSS21 and the other second common power line VSS22 may be disposed in the second non-transmissive area NTA2. Therefore, as shown in FIG. 13, each of one second common power line VSS21 and the other second common power line VS S22 may have a width W5 equal to the width W4 of the second non-transmissive area NTA2 or a width W5 narrower than the width W4 of the second non-transmissive area NTA2.

Consequently, the plurality of second common power lines VSS2 disposed in the second non-display area NDA2 may have a width W5 equal to the width W1 in the second direction of the first non-transmissive area NTA1 provided in the display area DA or a width W5 narrower than the width W1 in the second direction of the first non-transmissive area NTA1.

In the transparent display panel 110 according to one embodiment of the present disclosure, the second common power line VSS2 provided in the second non-display area NDA2 does not have a wide width. In the transparent display panel 110 according to one embodiment of the present disclosure, the width W5 of the second common power line VSS2 may be formed to be equal to or narrower than the width W1 of the first non-transmissive area NTA1 provided in the display area DA, whereby the wide second transmissive area TA2 may be obtained in the second non-display area NDA2.

Meanwhile, in the transparent display panel 110 according to one embodiment of the present disclosure, the second common power line VSS2 may be formed in a plural number, whereby a total area of the second common power line VSS2 may be increased.

Moreover, in the transparent display panel 110 according to one embodiment of the present disclosure, the second common power line VSS2 may be formed of a plurality of metal layers to increase its total area.

In detail, the second common power line VSS2 may be provided with a plurality of metal layers. For example, the second common power line VSS2, as shown in FIG. 15, may include a first metal layer VSS2-1 and a second metal layer VSS2-2 provided over the first metal layer VSS2-1. The second common power lines VSS2 may further include a third metal layer VSS2-3 provided over the second metal layer VSS2-2. The first metal layer VSS2-1 and the second metal layer VSS2-2 may partially be overlapped with each other, and may be connected with each other through a fifth contact hole CH5. At least a part of the third metal layer VSS2-3 may be overlapped with the second metal layer VSS2-2, and may directly be adjacent onto the second metal layer VSS2-2.

At this time, the first metal layer VSS2-1 of the second common power line VSS2 may be made of an opaque metal material of low resistance. For example, the second metal layer VSS2-1 of the second common power line VSS2 may be provided on the same layer as the source electrode SE and the drain electrode DE of the driving transistor T provided in the display area DA. The first metal layer VSS2-1 may be made of the same material as that of the source electrode SE and the drain electrode DE of the driving transistor T and may be formed simultaneously with them.

The second metal layer VSS2-2 of the second common power line VSS2 may be made of an opaque metal material of low resistance. For example, the second metal layer VSS2-2 of the second common power line VSS2 may be provided on the same layer as the anode auxiliary electrode 115 provided in the display area DA. The second metal layer VSS2-2 may be made of the same material as that of the anode auxiliary electrode 115 and may be formed simultaneously with the anode auxiliary electrode 115. In this case, the second metal layer VSS2-2 of the second common power line VSS2 may be connected to the first metal layer VSS2-1 through a plurality of fifth contact holes CH5 that pass through the first planarization film PLN1.

The third metal layer VSS2-3 of the second common power line VSS2 may be made of an opaque metal material of low resistance. For example, the third metal layer VSS2-3 of the second common power line VSS2 may be provided on the same layer as the anode electrode 120 provided in the display area DA. The third metal layer VSS2-3 may be made of the same material as that of the anode electrode 120 and may be formed simultaneously with the anode electrode 120.

In the transparent display panel 110 according to one embodiment of the present disclosure, as each of the plurality of second common power lines VSS2 provided in the second non-display area NDA2 is provided with a plurality of layers, a total area of the second common power line VSS2 may be increased. Therefore, in the transparent display panel 110 according to one embodiment of the present disclosure, even though the width W5 of the second common power line VSS2 is formed to be narrow, resistance of the second common power line VSS2 may be prevented from being increased.

Also, in the transparent display panel 110 according to one embodiment of the present disclosure, as the second metal layer VSS2-2 of the second common power line VSS2 may be connected to the first metal layer VSS2-1 of the second common power line VSS2 through the plurality of fifth contact holes CH5, the first metal layer VSS2-1 and the second metal layer VSS2-2 may stably be connected with each other.

Meanwhile, each of the second common power lines VSS2 may electrically be connected with the cathode electrode 140 through a cathode contact portion CCT. The cathode contact portion CCT may partially remove the bank 125 and partially expose the upper surface of the third metal layer VSS2-3 of the second common power lines VSS2. The cathode contact portion CCT may longitudinally expose the upper surface of the third metal layer VSS2-3 of the second common power lines VSS2 along the first direction (X axis direction). As a result, the second common power lines VSS2 may have a wide contact area with the cathode electrode 140, thereby being stably connected to the cathode electrode 140.

Each of the third common power lines VSSL may be extended from the display area DA in a second direction (Y axis direction) and connected with the second common power line VSS2. The third common power line VSSL may be connected to one second common power line VSS21 and the other second common power line VSS22. In detail, each of the third common power lines VSSL may be extended from the display area DA in a second direction (Y axis direction), and thus may be connected with one side of one second common power line VSS21. Also, each of the third common power lines VSSL may be extended from the other side of one second common power line VSS21 in a second direction (Y axis direction), and thus may be connected with one side of the other second common power line VSS22. Therefore, one second common power line VSS21, the other second common power line VSS22 and the third common power lines VSSL may electrically be connected with one another.

The third common power lines VSSL may be formed on the same layer as the second common power line VSS2 in the second non-display area NDA2. In detail, the third common power line VSSL may include a first metal layer VSSL-1 and a second metal layer VSSL-2 in the second non-display area NDA2. The first metal layer VSSL-1 of the third common power line VSSL may be extended from the first metal layer VSS2-1 of the second common power line VSS2, and the second metal layer VSSL-2 of the third common power line VSSL may be extended from the second metal layer VSS2-2 of the second common power line VSS2.

The second pixel power lines VDD2 may be provided between the second common power lines VSS2 and the display area DA as shown in FIG. 13. In this case, the third common power lines VSSL may include one of the first metal layer VSSL-1 and the second metal layer VSSL-2 in the area overlapped with the second pixel power lines VDD2.

For example, in some embodiments, the third common power lines VSSL may include only the first metal layer VSSL-1 of the first metal layer VSSL-1 and the second metal layer VSSL-2 in the area overlapped with the second pixel power lines VDD2 as shown in FIG. 15. At this time, the second pixel power lines VDD2 may include only the second metal layer VDD2-2 of the first metal layer VDD2-1 and the second metal layer VDD2-2 in the area overlapped with the third common power lines VSSL, and may not be electrically connected with the third common power lines VSSL.

In the transparent display panel 110 according to one embodiment of the present disclosure, the second common power line VSS2 may be formed in a plural number, and the plurality of second common power lines VSS2 may be spaced apart from one another to form the second transmissive area TA2. Also, in the transparent display panel 110 according to one embodiment of the present disclosure, the second pixel power line VDD2 may be formed in a plural number, and the plurality of second pixel power lines VDD2 may be spaced apart from one another to form the second transmissive area TA2. Therefore, in the transparent display panel 110 according to one embodiment of the present disclosure, since the second transmissive area TA2 is also provided in the non-display area NDA2 like the display area DA, transmittance in the second non-display area NDA2 may be improved.

The transparent display panel 110 according to one embodiment of the present disclosure may have similar transmittance in the second non-display area NDA2 and the display area DA. Accordingly, in some embodiments, in the transparent display panel 110 according to one embodiment of the present disclosure, an area of the first transmissive area TA1 provided in a unit area and an area of the second transmissive area TA2 provided in a unit area may be designed to be equal to each other.

In detail, in one embodiment, the second transmissive area TA2 provided in the second non-display area NDA2 may have the same shape as that of the first transmissive area TA1 provided in the display area DA.

Also, in the transparent display panel 110 according to one embodiment of the present disclosure, a width W7 in the first direction (X axis direction) of the second transmissive area TA2 provided in the second non-display area NDA2 may be equal to a width W6 in the first direction (X axis direction) of the first transmissive area TA1. This is because that a spaced distance between the third pixel power line VSSL and the third common power line VDDL in the second non-display area NDA2 is equal to a spaced distance between the third pixel power line VSSL and the third common power line VDDL in display area DA. The width in the first direction (X axis direction) of the transmissive areas TA1 and TA2 may be determined by the spaced distance between the third pixel power line VSSL and the third common power line VDDL.

Also, in the transparent display panel 110 according to one embodiment of the present disclosure, a width W2 in the second direction (Y axis direction) of the second non-transmissive area NTA2 provided in the second non-display area NDA2 may be equal to the width W1 in the second direction (Y axis direction) of the first non-transmissive areas NTA1 in display area DA.

Therefore, in the transparent display panel 110 according to one embodiment of the present disclosure, transmittance similar to that in the display area DA may be embodied in the second non-display area NDA2.

Moreover, the transparent display panel 110 according to one embodiment of the present disclosure may further include a color filter layer 170 in the second non-transmissive area NTA2 of the second non-display area NDA2.

In more detail, color filters CF1, CF2 and CF3 formed over the second pixel power line VDD2, the second common power line VSS2, the third pixel power lines VDDL and the third common power lines VSSL may be provided in the second non-transmissive area NTA2 of the second non-display area NDA2. At this time, the color filters CF1, CF2 and CF3 may be formed to be patterned in the second non-display area NDA2 in the same shape as that of the color filters CF1, CF2 and CF3 provided in the display area DA.

The color filter layer 170 may not be provided in the second transmissive area TA2 of the second non-display area NDA2 to enhance transmittance.

Therefore, in the transparent display panel 110 according to one embodiment of the present disclosure, a difference between transmittance in the second non-display area NDA2 and transmittance in the display area DA may be reduced or minimized.

Meanwhile, in the transparent display panel 110 according to one embodiment of the present disclosure, the pixel power line VDD, the common power line VSS and the reference line VREF may be provided in only the first non-display area NDA1 and the second non-display area NDA2 of the non-display area NDA. In the transparent display panel 110 according to one embodiment of the present disclosure, each of the pixel power line VDD, the common power line VSS and the reference line VREF may be formed in a double layer structure, and each of the common power line VSS and the reference line VREF provided in the first non-display area NDA1 may be connected with a plurality of connection electrodes. Therefore, in some embodiments, even though the pixel power line VDD, the common power line VSS and the reference line VREF are provided in only the first non-display area NDA1 and the second non-display area NDA2, the transparent display panel 110 according to one embodiment of the present disclosure may make sure of a sufficient area of each of the pixel power line VDD, the common power line VSS and the reference line VREF and reduce or minimize resistance.

In the transparent display panel 110 according to one embodiment of the present disclosure, as the pixel power line VDD, the common power line VSS and the reference line VREF are not provided in the third non-display area NDA3 and the fourth non-display area NDA4, transmittance in the third non-display area NDA3 and the fourth non-display area NDA4 may be improved. That is, the transparent display panel 110 according to one embodiment of the present disclosure may have transmittance even in the third non-display area NDA3 and the fourth non-display area NDA4, which is similar to that of the display area DA.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transparent display device, comprising:
a substrate provided thereon with a display area and a non-display area adjacent to the display area, the display area including a transmissive area and a non-transmissive area;
a plurality of subpixels provided on the display area;
at least one inorganic insulating film on the substrate;
at least one organic insulating film on the at least one inorganic insulating film;
anode electrodes provided in each of the plurality of subpixels on the at least one organic insulating film;
a bank provided among the anode electrodes;
a light emitting layer on the anode electrodes;
a cathode electrode on the light emitting layer;
an encapsulation film on the cathode electrode;
at least two color filters provided over the encapsulation film, each of the color filters overlapping at least part of the bank;
an adhesive layer provided between the at least two color filters, the adhesive layer adjoining a side surface of each of the at least two color filters; and
a step difference compensation film positioned between the encapsulation film and the cathode electrode in the transmissive area,
wherein the step difference compensation film is made of a material different from that of the at least one organic insulating film, and the step difference compensation film includes a transparent polyimide, wherein the adhesive layer is provided in the transmissive area and is made of a transparent material, wherein the at least one organic insulating film includes a first planarization film on the at least one inorganic insulating film and a second planarization film on the first planarization film, and wherein the at least one inorganic insulating film, the first planarization film, the second planarization film, and the bank are provided in only the non-transmissive area.

2. The transparent display device of claim 1, wherein the at least one inorganic insulating film and the at least one organic insulating film include an opening area overlapping the transmissive area.

3. The transparent display device of claim 1, wherein the bank overlays a side of the at least one inorganic insulating film and a side of the at least one organic insulating film, which are exposed from the opening area.

4. The transparent display device of claim 1, wherein the bank includes a material that absorbs light.

5. The transparent display device of claim 1, wherein a distance between the transmissive area and an end of the color filter is longer than a distance between the transmissive area and an end of the bank.

6. The transparent display device of claim 1, wherein the color filter adjoins an upper surface of the encapsulation film.

7. The transparent display device of claimer 1, wherein the encapsulation film includes a first inorganic film, an organic film on the first inorganic film, and a second inorganic film on the organic film, and the first inorganic film adjoins the step difference compensation film.

8. The transparent display device of claim 1, wherein the at least one inorganic insulating film is a high refractive film having a refractive index greater than 1.8.

* * * * *